United States Patent
Lee et al.

(10) Patent No.: US 10,282,580 B2
(45) Date of Patent: *May 7, 2019

(54) FINGERPRINT IDENTIFICATION DEVICE AND METHOD

(71) Applicant: SuperC-Touch Corporation, New Taipei (TW)

(72) Inventors: Hsiang-Yu Lee, New Taipei (TW); Shang Chin, New Taipei (TW); Ping-Tsun Lin, New Taipei (TW)

(73) Assignee: SUPERC-TOUCH CORPORATION, New Taipei (TW)

( * ) Notice: Subject to any disclaimer, the term of this patent is extended or adjusted under 35 U.S.C. 154(b) by 160 days.

This patent is subject to a terminal disclaimer.

(21) Appl. No.: 15/352,137

(22) Filed: Nov. 15, 2016

(65) Prior Publication Data

US 2017/0140198 A1 May 18, 2017

(30) Foreign Application Priority Data

Nov. 16, 2015 (TW) .............................. 104137665 A

(51) Int. Cl.
  *G06K 9/28* (2006.01)
  *G06K 9/00* (2006.01)
  *G11C 19/00* (2006.01)

(52) U.S. Cl.
  CPC ............ *G06K 9/0002* (2013.01); *G11C 19/00* (2013.01)

(58) Field of Classification Search
  CPC .................................................... G06K 9/0002
  See application file for complete search history.

(56) References Cited

U.S. PATENT DOCUMENTS

| 2008/0187192 A1* | 8/2008 | Shimamura .......... G06K 9/0002 382/124 |
| 2017/0038866 A1* | 2/2017 | Akhavan Fomani ... G06F 3/044 |

* cited by examiner

*Primary Examiner* — Brian Werner
(74) *Attorney, Agent, or Firm* — Muncy, Geissler, Olds & Lowe, P.C.

(57) ABSTRACT

A fingerprint identification device includes a substrate, at least two electrode areas, at least one dedicated sensing signal line, plural electrode selection switch groups, and plural signal lines. Each electrode area has plural electrodes. The signal lines are divided into plural first directional signal lines and plural second directional signal lines. The first directional signal lines are perpendicular to the second directional signal lines. The plural electrode selection switch groups sequentially or dynamically select at least one electrode as a sensing electrode block in each electrode area. The plural electrode selection switch groups configure the electrodes surrounding the sensing electrode block as at least two corresponding deflection electrode blocks. Each sensing electrode block is corresponding to at least two deflection electrode blocks. Each deflection electrode block has plural electrodes.

13 Claims, 47 Drawing Sheets

| j=k-1 | | | | | |
|---|---|---|---|---|---|
| jnX1 | k1X1 | k1X0 | k1L3 | k1L2 | k1L1 |
| 0 | 0 | 0 | R2 | R2 | R2 |
| 0 | 0 | 1 | R1 | R1 | R2 |
| 0 | 1 | 0 | Sk | R1 | R2 |
| 1 | 0 | 0 | R2 | R2 | R2 |
| 1 | 0 | 1 | R1 | R1 | R2 |
| 1 | 1 | 0 | Sj | R1 | R2 | k=2, j=1 ⇩

| 1nX1 | 21X1 | 21X0 | 21L3 | 21L2 | 21L1 |
|---|---|---|---|---|---|
| 0 | 0 | 0 | R2 | R2 | R2 |
| 0 | 0 | 1 | R1 | R1 | R2 |
| 0 | 1 | 0 | S2 | R1 | R2 |
| 1 | 0 | 0 | R2 | R2 | R2 |
| 1 | 0 | 1 | R1 | R1 | R2 |
| 1 | 1 | 0 | S1 | R1 | R2 |

| jnX1 | k1X1 | k1X0 | k1L3 | k1L2 | k1L1 |
|---|---|---|---|---|---|
| 0 | 0 | 0 | R22 | R22 | R22 |
| 0 | 0 | 1 | Rk1 | Rk1 | R22 |
| 0 | 1 | 0 | Sk | Rk1 | R22 |
| 1 | 0 | 0 | R22 | R22 | R22 |
| 1 | 0 | 1 | Rj1 | Rj1 | R22 |
| 1 | 1 | 0 | Sj | Rj1 | R22 | k=2, j=1 ⇩

| 1nX1 | 21X1 | 21X0 | 21L3 | 21L2 | 21L1 |
|---|---|---|---|---|---|
| 0 | 0 | 0 | R22 | R22 | R22 |
| 0 | 0 | 1 | R21 | R21 | R22 |
| 0 | 1 | 0 | S2 | R21 | R22 |
| 1 | 0 | 0 | R22 | R22 | R22 |
| 1 | 0 | 1 | R11 | R11 | R22 |
| 1 | 1 | 0 | S1 | R11 | R22 |

FIG. 15 j=k-1

| jnX1 or k1X1 | k2X1 | k2X0 | k2L3 | k2L2 | k2L1 |
|---|---|---|---|---|---|
| 0 | 0 | 0 | R22 | R22 | R22 |
| 0 | 0 | 1 | Rk1 | Rk1 | R22 |
| 0 | 1 | 0 | Sk | Rk1 | R22 |
| 1 | 0 | 0 | R22 | R22 | R22 |
| 1 | 0 | 1 | Rj1 | Rj1 | R22 |
| 1 | 1 | 0 | Sk | Rj1 | R22 | k=2, j=1 ⇩

| 1nX1 | 22X1 | 22X0 | 22L3 | 22L2 | 22L1 |
|---|---|---|---|---|---|
| 0 | 0 | 0 | R22 | R22 | R22 |
| 0 | 0 | 1 | R21 | R21 | R22 |
| 0 | 1 | 0 | S2 | R21 | R22 |
| 1 | 0 | 0 | R22 | R22 | R22 |
| 1 | 0 | 1 | R11 | R11 | R22 |
| 1 | 1 | 0 | S2 | R11 | R22 |

FIG. 16 l=k+1

| l1X1 | knX1 | knX0 | knL3 | knL2 | knL1 |
|------|------|------|------|------|------|
| 0 | 0 | 0 | R22 | R22 | R22 |
| 0 | 0 | 1 | Rk1 | Rk1 | R22 |
| 0 | 1 | 0 | Sk | Rk1 | R22 |
| 1 | 0 | 0 | R22 | R22 | R22 |
| 1 | 0 | 1 | Rl1 | Rl1 | R22 |
| 1 | 1 | 0 | Sk | Rk1 | R22 | k=1, l=2 ⇩

| 21X1 | 1nX1 | 1nX0 | 1nL3 | 1nL2 | 1nL1 |
|------|------|------|------|------|------|
| 0 | 0 | 0 | R22 | R22 | R22 |
| 0 | 0 | 1 | R11 | R11 | R22 |
| 0 | 1 | 0 | S1 | R11 | R22 |
| 1 | 0 | 0 | R22 | R22 | R22 |
| 1 | 0 | 1 | R21 | R21 | R22 |
| 1 | 1 | 0 | S1 | R21 | R22 |

SWkX1    (j=k-1, m=n-1)

| jmX1 | jnX1 | k1X1 | k1X0 | k1L1 | k1L2 | k1L3 |
|---|---|---|---|---|---|---|
| 0 | 0 | 0 | 0 | Rk2 | Rk2 | Rk2 |
| 0 | 0 | 0 | 1 | Rk2 | Rk1 | Rk1 |
| 0 | 0 | 1 | 0 | Rk2 | Rk1 | Sk |
| 0 | 1 | 0 | 0 | Rj2 | Rj2 | Rj2 |
| 0 | 1 | 0 | 1 | Rj2 | Rj1 | Rj1 |
| 0 | 1 | 1 | 0 | Rj2 | Rj1 | Sj |
| 1 | 0 | 0 | 0 | Rj2 | Rj2 | Rj2 |
| 1 | 0 | 0 | 1 | Rj2 | Rj1 | Rj1 |
| 1 | 0 | 1 | 0 | Rj2 | Rj1 | Sj |
| 1 | 1 | 0 | 0 | Rj2 | Rj2 | Rj2 |
| 1 | 1 | 0 | 1 | Rj2 | Rj1 | Rj1 |
| 1 | 1 | 1 | 0 | Rj2 | Rj1 | Sj |

SWkX2 (j=k-1)

| jnX1 | k2X1 | k2X0 | k2L1 | k2L2 | k2L3 |
|------|------|------|------|------|------|
| 0 | 0 | 0 | Rk2 | Rk2 | Rk2 |
| 0 | 0 | 1 | Rk2 | Rk1 | Rk1 |
| 0 | 1 | 0 | Rk2 | Rk1 | Sk |
| 1 | 0 | 0 | Rj2 | Rj2 | Rj2 |
| 1 | 0 | 1 | Rj2 | Rj1 | Rj1 |
| 1 | 1 | 0 | Rj2 | Rj1 | Sk |

SWkX3         (j=k-1)

| jnX1 | k1X1 | k3X1 | k3X0 | k3L1 | k3L2 | k3L3 |
|---|---|---|---|---|---|---|
| 0 | 0 | 0 | 0 | Rk2 | Rk2 | Rk2 |
| 0 | 0 | 0 | 1 | Rk2 | Rk1 | Rk1 |
| 0 | 0 | 1 | 0 | Rk2 | Rk1 | Sk |
| 0 | 1 | 0 | 0 | Rk2 | Rk2 | Rk2 |
| 0 | 1 | 0 | 1 | Rk2 | Rk1 | Rk1 |
| 0 | 1 | 1 | 0 | Rk2 | Rk1 | Sk |
| 1 | 0 | 0 | 0 | Rk2 | Rk2 | Rk2 |
| 1 | 0 | 0 | 1 | Rk2 | Rk1 | Rk1 |
| 1 | 0 | 1 | 0 | Rk2 | Rk1 | Sk |
| 1 | 1 | 0 | 0 | Rj2 | Rj2 | Rj2 |
| 1 | 1 | 0 | 1 | Rj2 | Rk1 | Rj1 |
| 1 | 1 | 1 | 0 | Rj2 | Rk1 | Sk |

(rows marked * : "1 0 1 0" and "1 1 1 0")

|  | SWkXn |  | (l=k+1) |  |  |  |
|---|---|---|---|---|---|---|
| l2X1 | l1X1 | knX1 | knX0 | knL1 | knL2 | knL3 |
| 0 | 0 | 0 | 0 | Rk2 | Rk2 | Rk2 |
| 0 | 0 | 0 | 1 | Rk2 | Rk1 | Rk1 |
| 0 | 0 | 1 | 0 | Rk2 | Rk1 | Sk |
| 0 | 1 | 0 | 0 | Rk2 | Rk2 | Rk2 |
| 0 | 1 | 0 | 1 | Rk2 | Rk1 | Rk1 |
| 0 | 1 | 1 | 0 | Rk2 | Rk1 | Sk |
| 1 | 0 | 0 | 0 | Rl2 | Rl2 | Rl2 |
| 1 | 0 | 0 | 1 | Rl2 | Rl1 | Rl1 |
| * 1 | 0 | 1 | 0 | Rk2 | Rk1 | Sk |
| 1 | 1 | 0 | 0 | Rl2 | Rl2 | Rl2 |
| 1 | 1 | 0 | 1 | Rl2 | Rl1 | Rl1 |
| * 1 | 1 | 1 | 0 | Rk2 | Rk1 | Sk |

SWkXm         (l=k+1)

| l1X1 | knX1 | kmX1 | kmX0 | kmL1 | kmL2 | kmL3 |
|---|---|---|---|---|---|---|
| 0 | 0 | 0 | 0 | Rk2 | Rk2 | Rk2 |
| 0 | 0 | 0 | 1 | Rk2 | Rk1 | Rk1 |
| 0 | 0 | 1 | 0 | Rk2 | Rk1 | Sk |
| 0 | 1 | 0 | 0 | Rk2 | Rk2 | Rk2 |
| 0 | 1 | 0 | 1 | Rk2 | Rk1 | Rk1 |
| 0 | 1 | 1 | 0 | Rk2 | Rk1 | Sk |
| 1 | 0 | 0 | 0 | Rl2 | Rl2 | Rl2 |
| 1 | 0 | 0 | 1 | Rl2 | Rk1 | Rk1 |
| 1 | 0 | 1 | 0 | Rl2 | Rk1 | Sk |
| 1 | 1 | 0 | 0 | Rk2 | Rk2 | Rk2 |
| 1 | 1 | 0 | 1 | Rk2 | Rk1 | Rk1 |
| 1 | 1 | 1 | 0 | Rk2 | Rk1 | Sk |

FINGERPRINT IDENTIFICATION DEVICE AND METHOD

BACKGROUND OF THE INVENTION

1. Field of the Invention

The present invention relates to the technical field of biological feature detection and, more particularly, to a fingerprint identification device and method.

2. Description of Related Art

The development of electronic commerce promotes remote payment, in which there is demand for biological feature detection. The technology of biological feature detection includes such as fingerprint detection, iris detection or DNA detection. Considering the requirement for efficiency, safety and non-inversion, the fingerprint detection becomes the primary technology in biological feature detection. The fingerprint detection further includes optical type, thermal type, ultrasonic type and capacitance type, wherein the capacitance type stands out in this field by its size, cost, power saving, stability and anti-fake function.

The prior capacitance type fingerprint detection technology includes sliding type and press type, wherein the press type stands out by its accuracy, efficiency and convenience. However, since the sensing signals are weak and the surrounding noise signals are strong, the press type fingerprint detection only can integrate the sensing electrodes with the sensing circuits into an integrated circuit on a chip protected by a sapphire film with a thickness smaller than 100 µm. This results in high cost of materials and package manufacturing, and low lifetime and tolerance of the product. Thus, the industry is devoted to improve the sensing sensitivity and the signal to noise ratio, in order to increase the sensing distance between the sensing electrodes and the fingerprint, for simplifying the package of the sensing integrated circuit, or allowing the sensing operation directly under the protection glass. Moreover, it is expected to dispose the sensing electrodes on a substrate out of the integrated circuit to significantly decrease the chip area, and integrate the sensing electrodes into a protection glass or a display panel, for reducing the cost and increasing the lifetime and the tolerance of the product. Therefore, the fingerprint detection technology is desired to be improved.

SUMMARY OF THE INVENTION

The main purpose of the present invention is to provide a fingerprint identification device, which uses a plurality of selecting switch components to sequentially or dynamically divide a plurality of electrode areas into at least one sensing electrode block and a plurality of corresponding deflection electrode blocks. It sequentially or dynamically selects at least one electrode as a sensing electrode block (sensing area). When the sensing electrode block (sensing area) shifts across different electrode areas, it can select a deflection focusing signal in the original electrode area to apply to the deflection focusing area, or select a deflection focusing signal in the new electrode area to apply to the deflection focusing area, thereby gathering and pulling up the electric flux lines from the electrodes in the sensing area. Thus, it can enhance the sensing sensitivity, stability and accuracy, increase the sensing distance, improve the signal-noise ratio, and reduce the cost of fingerprint detection device.

According to a feature of the present invention, the present invention provides a fingerprint identification device, which includes a substrate, at least two electrode areas, at least one dedicated sensing signal line, a plurality of electrode selection switch groups and a plurality of signal lines. Each electrode area of the at least two electrode areas includes a plurality of electrodes. The signal lines are divided into first directional signal lines and second directional signal lines. The first directional signal lines are perpendicular to the second directional signal lines; wherein the electrode selection switch groups sequentially or dynamically select at least one electrode from the electrodes in their respective electrode areas as a sensing electrode block, and configure the electrodes surrounding the sensing electrode block as a plurality of corresponding deflection electrode blocks. Each sensing electrode block is corresponding to at least two deflection electrode blocks. Each deflection electrode block of the at least two deflection electrode blocks includes a plurality of electrodes.

According to another feature of the present invention, the present invention provides a fingerprint identification device, which includes: a substrate, a plurality of electrode areas and a plurality of first directional signal lines. Each electrode area includes a plurality of electrodes, a plurality of second directional signal lines, a plurality of electrode selection switch groups, a plurality of sensing and deflection signal selection switch groups and at least one dedicated sensing signal line. The electrodes are disposed on the substrate along the first direction and the second direction. The first direction is perpendicular to the second direction. The second directional signal lines are extending along the second direction. The second directional signal lines are corresponding to the electrodes. Each electrode selection switch group includes a plurality of selecting switch component, and each electrode selection switch group is corresponding to an electrode. Each sensing and deflection signal selection switch group is connected to the second directional signal lines. The at least one dedicated sensing signal line is connected to the sensing and deflection signal selection switch groups in the electrode area. The first directional signal lines are extending along the first direction. The first directional signal lines are corresponding to the electrodes in the electrode area.

According to still another feature of the present invention, the present invention provides a fingerprint identification method, which is applied in a fingerprint identification device. The fingerprint identification device has a plurality of electrode areas. Each electrode area includes at least one dedicated sensing signal line, a plurality of electrodes, a plurality of electrode selection switch groups and a plurality of sensing and deflection signal selection switch groups. Each electrode selection switch group is corresponding to an electrode. The electrodes are disposed on a sensing surface in rows and columns. The fingerprint identification method includes: (A) sequentially or dynamically configuring the electrodes in each electrode area into at least three areas through the electrode selection switch groups and the sensing and deflection signal selection switch groups, the at least three areas being a sensing area, a deflection focusing area and a convergence stabilizing area, respectively, wherein each deflection focusing area is composed of the electrode surrounding each sensing area, and each convergence stabilizing area is composed of the electrodes surrounding each deflection focusing area; (B) applying a sensing stimulating signal to the electrodes in each sensing area through the at least one dedicated sensing signal line in each electrode area; (C) applying a deflection focusing signal to the electrodes in the deflection focusing area in each electrode area; (D) applying a convergence stabilizing signal to the electrodes in the convergence stabilizing area in each electrode area; and (E) outputting a sensing signal from the at least one dedicated sensing signal line in each electrode area to a self-capacitance sensing circuit, in order to sensing a fingerprint.

Other objects, advantages, and novel features of the invention will become more apparent from the following detailed description when taken in conjunction with the accompanying drawings.

BRIEF DESCRIPTION OF THE DRAWINGS

FIGS. 4A to 4C and FIGS. 5A to 5F illustrate an operation of the fingerprint identification device according to the present invention;

FIGS. 9A to 9C and FIGS. 10A to 10F illustrate another operation of the fingerprint identification device according to the present invention;

FIG. 11 is a first truth table of the sensing and deflection signal selection switch group according to the present invention;

FIGS. 12A to 12C, FIGS. 13A to 13F and FIGS. 14A to 14F illustrate still another operation and yet another operation of the fingerprint identification device according to the present invention;

FIG. 15 is a second truth table of the sensing and deflection signal selection switch group according to the present invention;

FIG. 16 is a third truth table of the sensing and deflection signal selection switch group according to the present invention;

FIG. 17 is a fourth truth table of the sensing and deflection signal selection switch group according to the present invention;

FIGS. 18A to 18C, FIGS. 19A to 19F and FIGS. 20A to 20F illustrate further another operation and still further another operation of the fingerprint identification device according to the present invention;

FIG. 21 is a fifth truth table of the sensing and deflection signal selection switch group according to the present invention;

FIG. 22 is a sixth truth table of the sensing and deflection signal selection switch group according to the present invention;

FIG. 23 is a seventh truth table of the sensing and deflection signal selection switch group according to the present invention;

FIG. 24 is an eighth truth table of the sensing and deflection signal selection switch group according to the present invention;

FIG. 25 is a ninth truth table of the sensing and deflection signal selection switch group according to the present invention.

DETAILED DESCRIPTION OF THE PREFERRED EMBODIMENT

Figure 1:
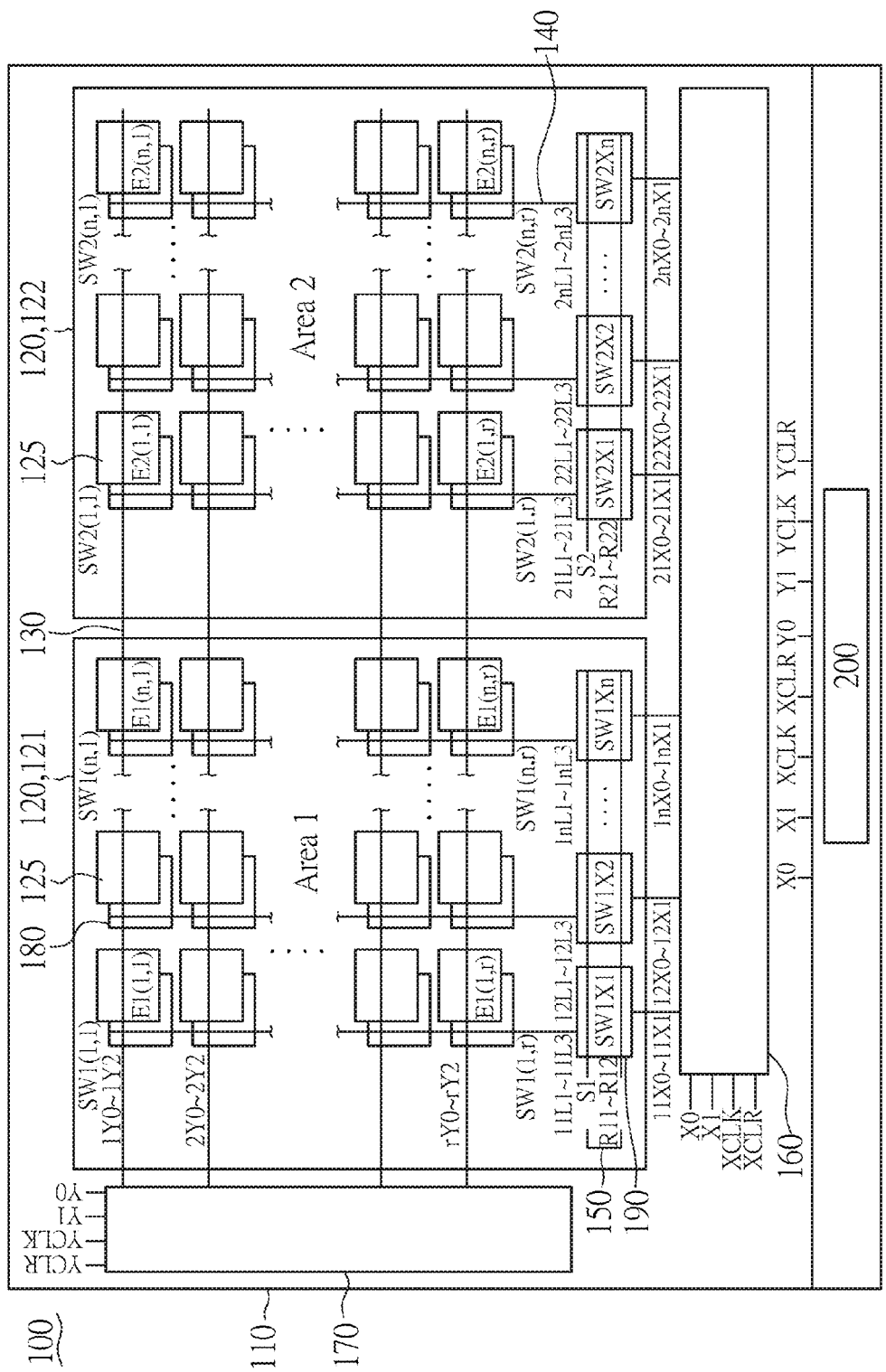
FIG. 1 is the schematic diagram of a preferred embodiment of the fingerprint identification device according to the present invention.

FIG. 1 is the schematic diagram of a preferred embodiment of the fingerprint identification device 100 according to the present invention. The fingerprint identification device 100 includes a substrate 110, at least two electrode areas 120, a plurality of first directional signal lines 130, a plurality of second directional signal lines 140, at least one dedicated sensing signal line 150, a first sensing and deflection electrode configuration circuit 160, a second sensing and deflection electrode configuration circuit 170, a plurality of electrodes 125, a plurality of electrode selection switch groups 180, a plurality of sensing and deflection signal selection switch groups 190, and a control circuit 200.

The substrate 110 is preferably made of glass, polymer film, metal, silicon or silicide. The electrodes 125 and the electrode selection switch groups 180 are disposed on the substrate 110. The electrodes 125 and the electrode selection switch groups 180 are disposed on the substrate 110 along a first direction (X-axis direction) and a second direction (Y-axis direction) in rows and columns. The first direction is substantially perpendicular to the second direction. Each electrode selection switch group 180 is corresponding to an electrode 125, and they are at least partially overlapped. In order to show the electrode selection switch group 180 and the electrode 125 in FIG. 1, the electrode selection switch group 180 is shown slightly shifted to the electrode 125.

The electrodes 125 on the substrate 110 are divided into at least two electrode areas 120. Correspondingly, the electrode selection switch groups 180 are divided into a plurality of electrode area selection switch groups. As shown in FIG. 1, the electrode selection switch groups 180 in the electrode area 121 form a first electrode area selection switch group, and the electrode selection switch groups 180 in the electrode area 122 form a second electrode area selection switch group.

The electrode selection switch groups 180 are field effect transistors or thin film transistors disposed on the substrate 110. The electrode selection switch groups 180 sequentially or dynamically select at least one electrode from the electrodes 125 in the electrode areas 121, 122 as a sensing electrode block, and configure the electrodes surrounding the sensing electrode block as a plurality of corresponding deflection electrode blocks. Each sensing electrode block is corresponding to at least two deflection electrode blocks. Each deflection electrode blocks of the at least two deflection electrode blocks includes a plurality of electrodes.

The first directional signal lines 130 are extending along the first direction (X). The first directional signal lines 130 are corresponding to the electrodes 125 in the electrode areas 120. Each of the first directional signal lines 130 is electrically connected to at least one electrode selection switch groups 180 of a plurality of electrode selection switch groups 180. As shown in FIG. 1, the first directional signal lines 130 (1Y0-1Y2) are connected to and control the electrode selection switch groups 180 in the same row. The first directional signal lines 130 control the electrode selection switch groups 180 to select the electrode 125 to electrically connect to which of the second directional signal lines 140 (11L1-11L3). At the same time, the control signals 11X0-11X1 control the sensing and deflection signal selection switch group 190 to select each of the second directional signal lines 140 (11L1-11L3) to connect to one of the at least one dedicated sensing signal lines 150 (S1, R11, R12), and so on. The similar details are applied and a detailed description is deemed unnecessary.

The second directional signal lines 140 are extending along the second direction (Y). The second directional signal lines 140 are corresponding to the electrodes 125. Each sensing and deflection signal selection switch group 190 of a plurality of sensing and deflection signal selection switch groups 190 is connected to the second directional signal lines 140.

The first sensing and deflection electrode configuration circuit 160 is connected to the sensing and deflection signal selection switch groups 190 and the control circuit 200. The first sensing and deflection electrode configuration circuit 160 is disposed along the first direction. The first sensing and deflection electrode configuration circuit 160 is a shift register circuit. The first sensing and deflection electrode configuration circuit 160 outputs the control signal to the sensing and deflection signal selection switch group 190 to select each of the second directional signal lines 140 to electrically connect to a sensing stimulating signal S1, a deflection focusing signal R11 or a convergence stabilizing signal R12. In other embodiments, the first sensing and deflection electrode configuration circuit 160 is composed of an address decoder and a data latch circuit. Symbols S1, R11, R12 represent the sensing stimulating signal S1, the deflection focusing signal R11 and the convergence stabilizing signal R12, respectively, and they also represent the line transmitting the sensing stimulating signal, the deflection focusing signal and the convergence stabilizing signal.

The second sensing and deflection electrode configuration circuit 170 is connected to the first directional signal lines 130 and the control circuit 200, and it is disposed along the second direction. The second sensing and deflection electrode configuration circuit 170 is a shift register circuit. The second sensing and deflection electrode configuration circuit 170 outputs a control signal to the first directional signal lines 130 to select each of the electrodes to electrically connect to which of second directional signal lines 140. In other embodiments, the second sensing and deflection electrode configuration circuit 170 is composed of an address decoder and a data latch circuit.

The control circuit 200 is connected to the first sensing and deflection electrode configuration circuit 160 and the second sensing and deflection electrode configuration circuit 170, for setting the first sensing and deflection electrode configuration circuit 160 and the second sensing and deflection electrode configuration circuit 170, sequentially or dynamically selecting at least one electrode from the electrodes 125 in the electrode areas 120 as a sensing electrode block, and configuring the electrodes surrounding the sensing electrode block as a plurality of corresponding deflection electrode blocks. Each sensing electrode block is corresponding to at least two deflection electrode blocks. Each deflection electrode blocks of the at least two deflection electrode blocks includes a plurality of electrodes.

That is, the electrodes 125 in the electrode area 121 can be configured into at least three areas. The at least three areas are a sensing area, a deflection focusing area and a convergence stabilizing area, respectively. The sensing electrode block is the sensing area, and the at least two deflection electrode blocks are the deflection focusing area and the convergence stabilizing area, wherein each deflection focusing area is composed of the electrodes surrounding the sensing area, and each convergence stabilizing area is composed of the electrodes surrounding each deflection focusing area.

The control circuit 200 can shift the positions of the selected sensing electrode block and its deflection electrode blocks along the first direction or the second direction.

The control circuit 200 can be arranged on the substrate 110, or the control circuit 200 can be arranged on a flexible circuit board, and is connected to the first sensing and deflection electrode configuration circuit 160 and the second sensing and deflection electrode configuration circuit 170 through a bus wire.

As shown in FIG. 1, the electrode area 121 and the electrode area 122 each has a sensing stimulating signal S1 and a sensing stimulating signal S2.

Figure 2:
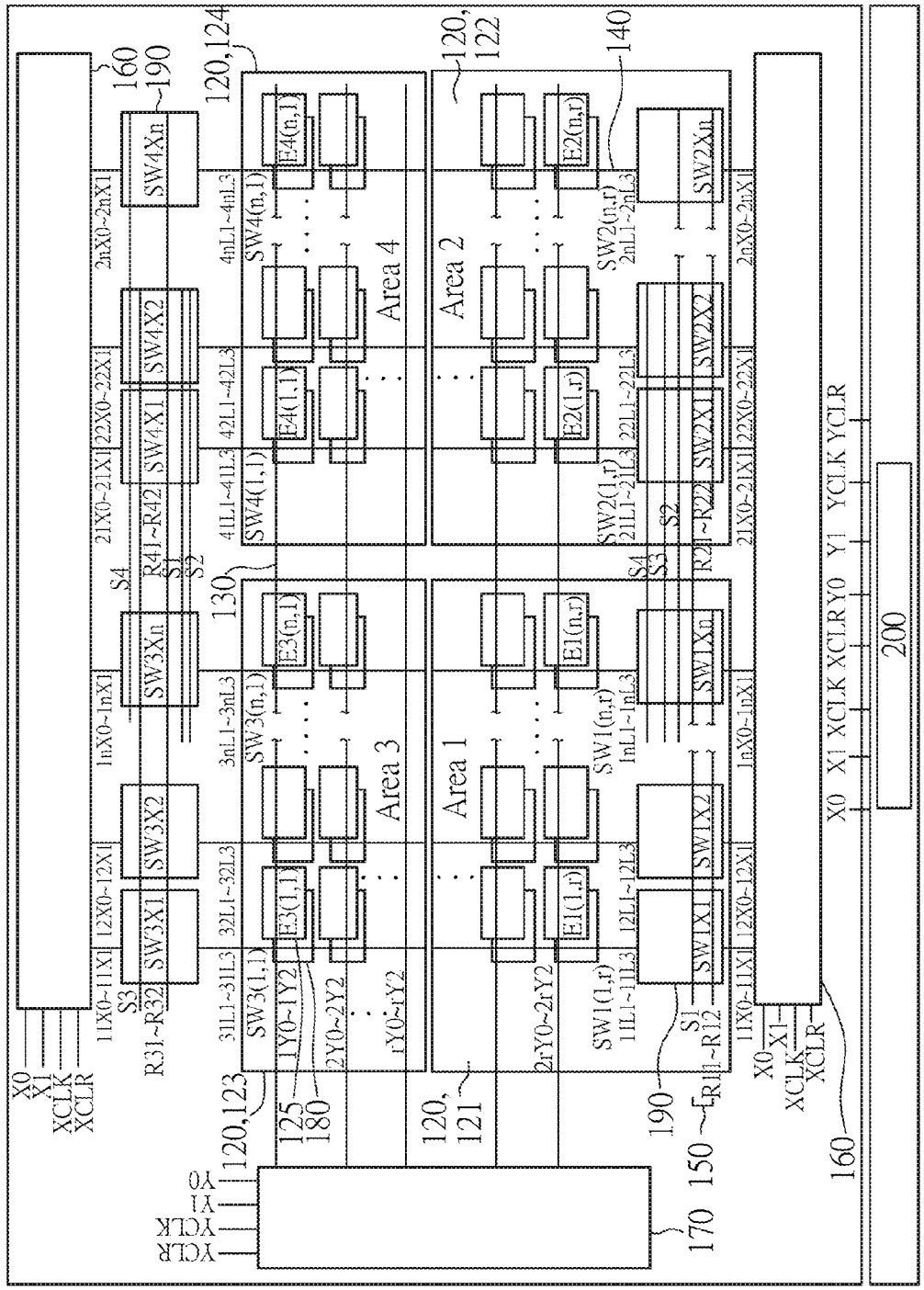
FIG. 2 is the schematic diagram of another preferred embodiment the fingerprint identification device according to the present invention.

FIG. 2 is the schematic diagram of a preferred embodiment of the fingerprint identification device 100 according to the present invention, which is similar to FIG. 1 except that: there are both a first sensing and deflection electrode configuration circuit 160 and the corresponding sensing and deflection signal selection switch groups 190 on the substrate 110. Therefore, the electrodes 125 on the substrate 110 can be divided into four electrode areas 121, 122, 123, 124. The sensing stimulating signal S1 in the electrode area 121 extends to the electrode area 122, and the sensing stimulating signals S2, S3, S4 in the electrode area 122 extend to the electrode area 121.

Figure 3A:
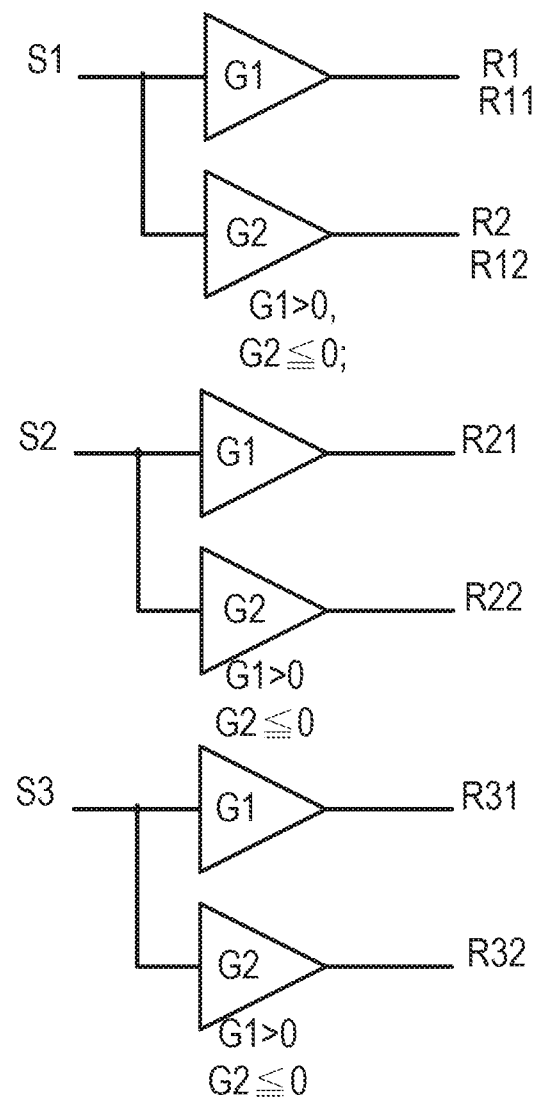
FIGS. 3A to 3C are the schematic diagrams illustrating the signal generating circuit according to the present invention.
Figure 3B:
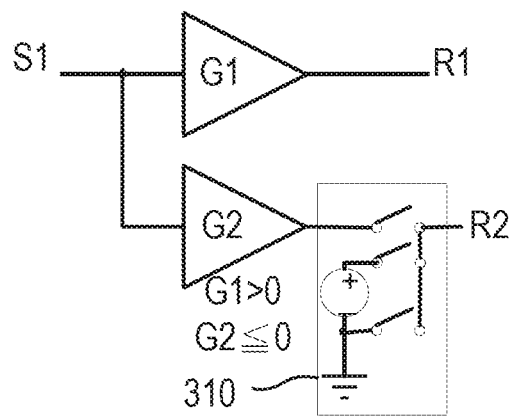
Figure 3C:
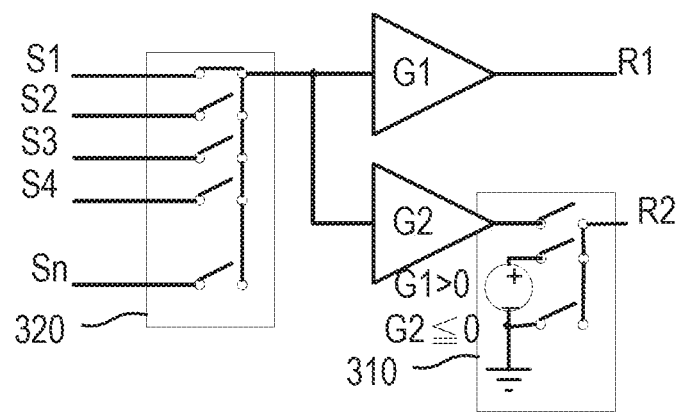

FIGS. 3A to 3C are the schematic diagrams illustrating the signal generating circuit according to the present invention. The sensing stimulating signals S1, S2, S3 generate the deflection focusing signals R1, R11, R21, R31, and the convergence stabilizing signals R2, R12, R22, R32. The sensing stimulating signals S1, S2, S3 are each a periodical or non-periodical AC signal. The sensing stimulating signals S1, S2, S3 are electrically connected to the sensing electrode block (or sensing area).

When a sensing electrode block (or a sensing area) senses a touch or an approaching of an external object, the sensing stimulating signal S1, S2, S3 applied to the sensing electrode block (or sensing area) is converted into a sensing signal. Thus, the at least one dedicated sensing signal line 150 in each electrode area 120 can output a sensing signal to a self-capacitance sensing circuit for fingerprint detection. In one embodiment, since the lines S1, S2, S3 of at least one dedicated sensing signal lines 150 are connected to the sensing electrode block (or sensing area), the lines S1, S2, S3 can output the sensing signal to the self-capacitance sensing circuit. The self-capacitance sensing circuit can be arranged inside the control circuit 200, or be a single integrated circuit.

The sensing stimulating signal S1 is processed by at least one signal amplifier circuit G1 with a gain not less than zero and becomes a deflection focusing signals R1 (R11), which is in-phase to the sensing stimulating signal S1. The deflection focusing signal R1 (R11) is electrically connected to one of the at least two deflection electrode blocks (deflection focusing areas). The at least one signal amplifier circuit G1 with a gain not less than zero is disposed on the substrate 110 or disposed in an integrated circuit (not shown) out of the substrate 110. The gain of the at least one signal amplifier circuit G1 with a gain not less than zero can be a constant or a programmable one.

The sensing stimulating signal S1 is processed by the at least one signal amplifier circuit G2 with a gain not more than zero and becomes a convergence stabilizing signal R2 (R12), which is inverted to the sensing stimulating signal S1. The convergence stabilizing signal R2 (R12) is electrically connected to one of the at least two deflection electrode blocks (convergence stabilizing areas). The at least one signal amplifier circuit G2 with a gain not more than zero is disposed on the substrate 110 or disposed in an integrated circuit (not shown) out of the substrate 110. The gain of the at least one signal amplifier circuit G2 with a gain not more than zero can be a constant or programmable one. The other sensing stimulating signal S2, S3, deflection focusing signal R21, R31, convergence stabilizing signal R22, R32 are similarly configured, so a detailed description is deemed unnecessary.

The deflection focusing signal R11 applied to each electrode area 120 is an in-phase signal generated by a circuit from the sensing signal or the sensing stimulating signal S1 in the corresponding sensing electrode block (or sensing area). The convergence stabilizing signal R12 applied to each electrode area 120 is an inverted signal generated through a circuit from the sensing signal or the sensing stimulating signal S1 in the corresponding sensing electrode block (or sensing area).

In other embodiments, the deflection focusing signal R11 applied to each electrode area 120 is the same in-phase signal generated by a circuit from the sensing signal or the sensing stimulating signal S1 in a selected sensing electrode block (or sensing area). The convergence stabilizing signal R12 applied to each electrode area 120 is the same inverted signal generated by a circuit from the sensing signal or the sensing stimulating signal in a selected sensing electrode block (or sensing area).

In other embodiments, the convergence stabilizing signal R12 applied to each electrode area 120 is a DC reference voltage or a ground signal.

At least one signal amplifier circuit G2 with a gain not more than zero processes and generates a signal inverted to the sensing stimulating signal S1. Then, a first selecting device 310 selects from the output of the amplifier circuit G2, a DC reference voltage or a ground signal to output a convergence stabilizing signal R2.

In FIG. 3B, the sensing stimulating signal S1 processed by the at least one signal amplifier circuit G2 with a gain not more than zero and becomes a signal inverted to the sensing stimulating signal S1. A first selecting device 310 selects from the output of the amplifier circuit G2, a DC reference voltage or a ground signal to output a convergence stabilizing signal R2. In FIG. 3C, a second selecting device 320 selects from the sensing stimulating signals S1, S2, S3, . . . , Sn in the respective electrode areas 120 to generate a deflection focusing signal R1 and a convergence stabilizing signal R2.

FIGS. 4A to 4C and FIGS. 5A to 5F illustrate an operation of the fingerprint identification device according to the present invention. In FIG. 4, the electrodes 125 on the substrate 110 are divided into a plurality of electrode areas 121, 122, 123, . . . . The electrodes 125 in the respective electrode areas 121, 122, 123, . . . can be divided into three areas, which are a sensing area (represented by dashed slash lines "/"), a deflection focusing area (represented by transverse solid lines "-") and a convergence stabilizing area (represented by lengthwise solid lines "|"). As shown in FIG. 4, the sensing stimulating signals S1, S2, S3 or the sensing stimulating signal lines S1, S2, S3 only present in the corresponding electrode area 1, electrode area 2 and electrode area 3, and do not stretch across the adjacent electrode areas.

Figures 5A, 5B:
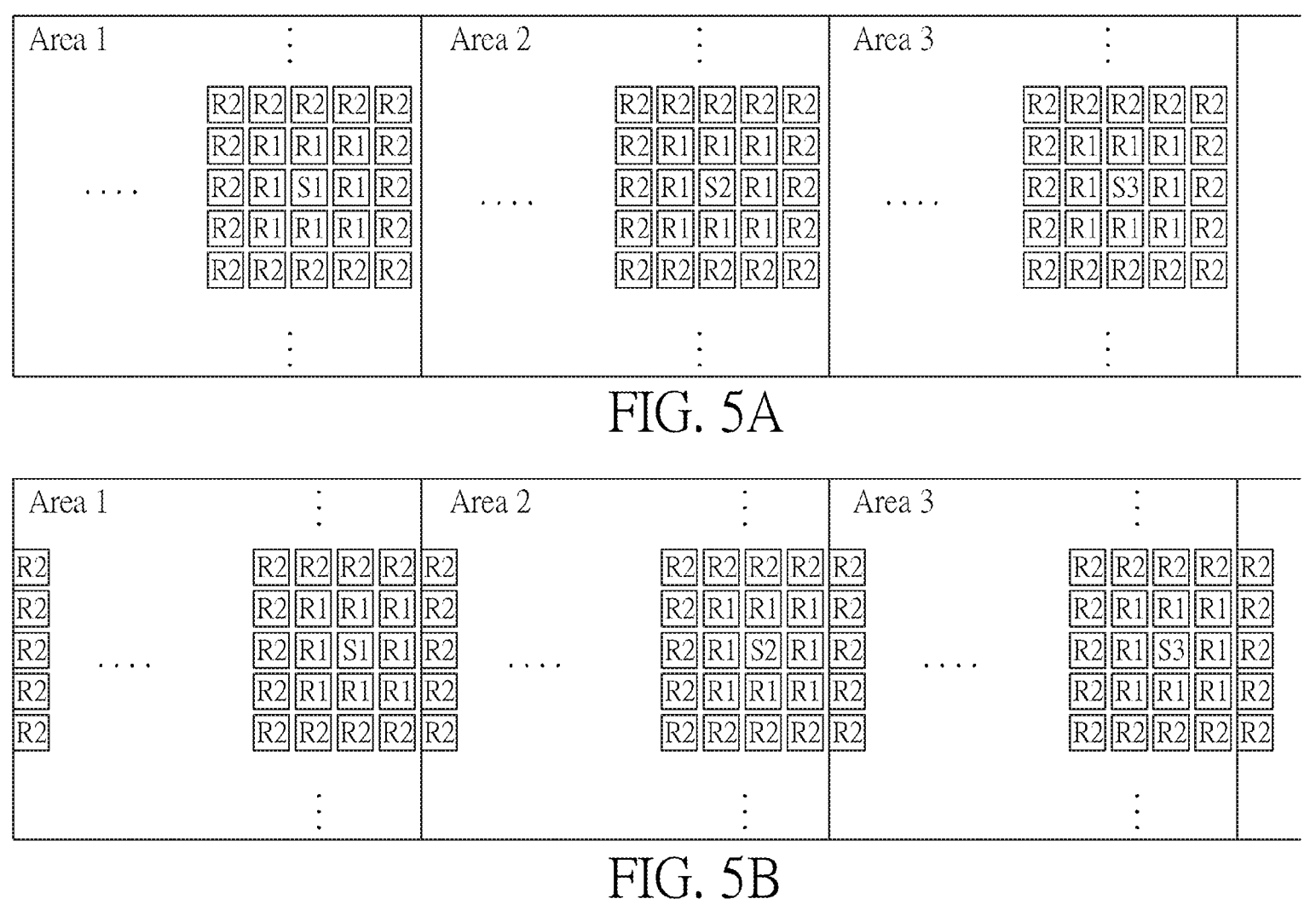
Figures 5C, 5D:
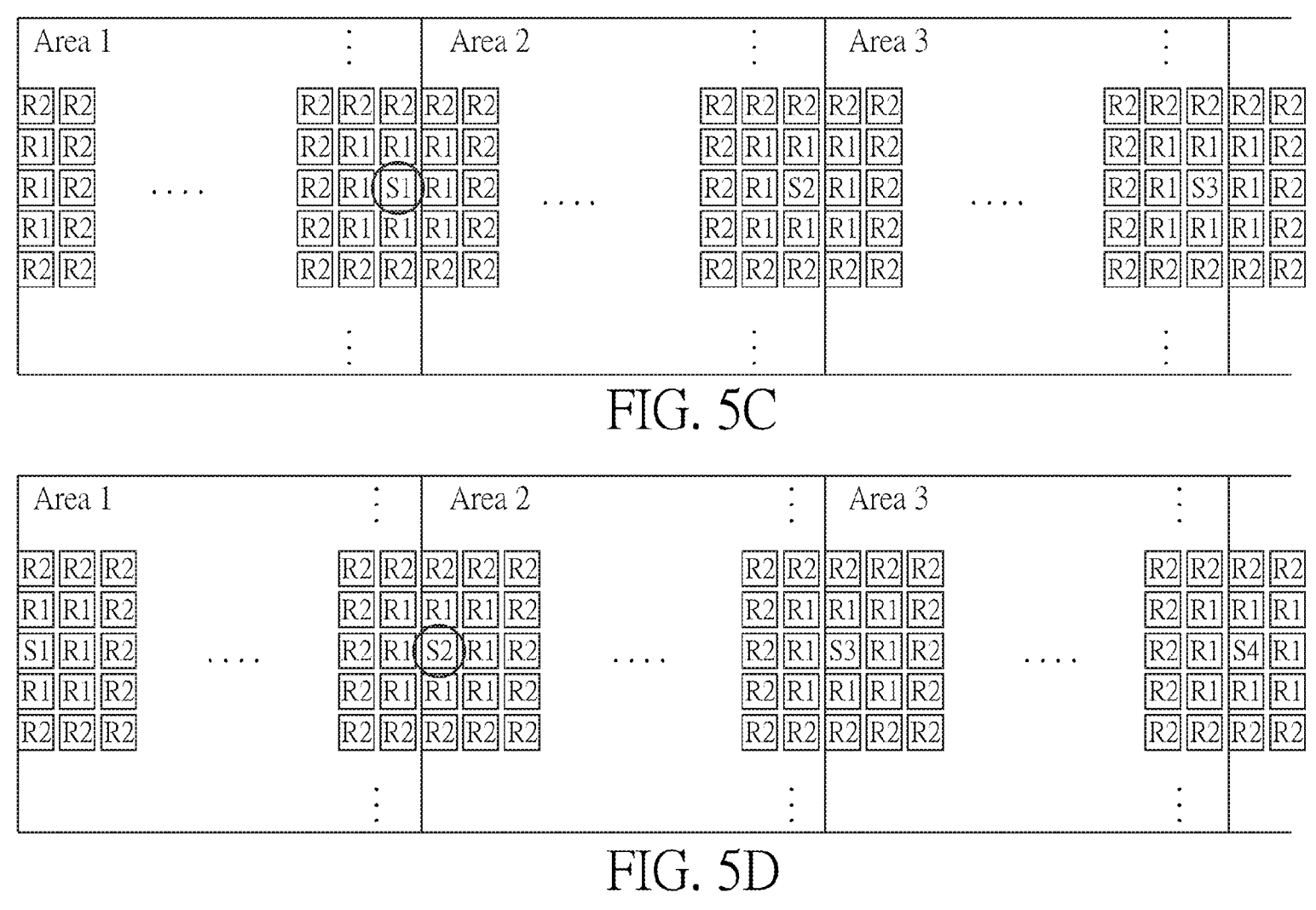
Figures 5E, 5F:
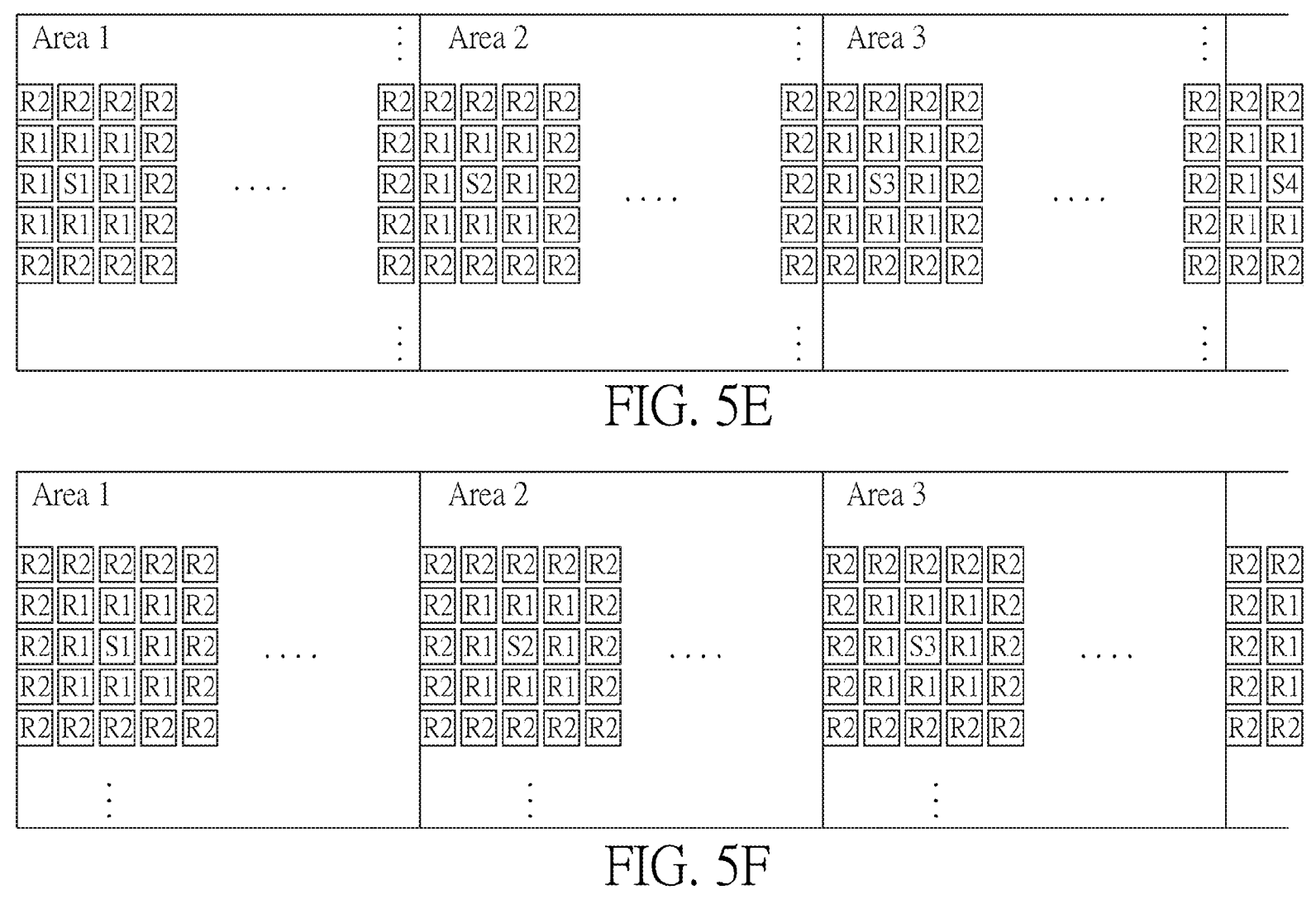

FIGS. 5A to 5F show the schematic diagram of the position of a sensing area group composed of a sensing area, a deflection focusing area and a convergence stabilizing area shifting across the electrode area 1 and the electrode area 2. In FIGS. 5A and 5F, the electrodes 125 in the sensing area are represent with an initial "S", for example, S1, S2, S3 represent three sensing areas. The electrodes 125 in the deflection focusing area are marked "R1", and the electrodes 125 in the convergence stabilizing area are marked "R2". That is, in the present invention, R1 represents an electrode applied with a deflection focusing signal R1, and it also represents a deflection focusing signal itself, and so on.

As shown in FIG. 5A, the sensing area group composed of the sensing area, the deflection focusing area and the convergence stabilizing area is located in the border between the electrode area 1 and electrode area 2. As shown in FIG. 5B, the position of the sensing area group shifts across the border between the electrode area 1 and the electrode area 2 for over an electrode size. As shown in FIG. 5C, it shifts across for over two electrode sizes, and so on. It is noted that, the electrodes 125 in the sensing area are originally applied with the sensing stimulating signal S1, and after it shifts across the electrode area 2, it is applied with the sensing stimulating signal S2 instead, as shown in FIG. 5D.

Figure 6:
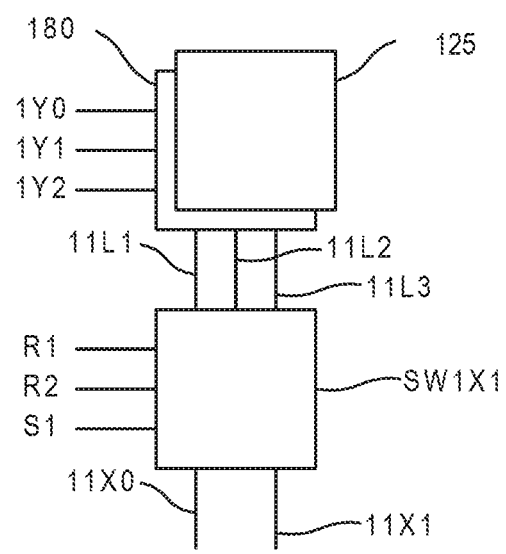
FIG. 6 is the operation diagram of the electrode and the electrode selection switch group according to the present invention.

FIG. 6 is the operation diagram of the electrode and the electrode selection switch group 180 according to the present invention. As shown in FIG. 6, the electrodes 125 in the sensing area are represent with an initial "S". The electrodes 125 in the deflection focusing area are marked "R1", and the electrodes 125 in the convergence stabilizing area are marked "R2". Referred to FIG. 4 and FIG. 5A to 5F, each electrode 125 has 5 bits, wherein the lower bits (bit2, bit1, bit0) is corresponding to three horizontal lines 1Yp-1Y0, 2Yp-2Y0, . . . , mYp-mY0, to control which of the vertical lines 11L3-11L1, 12L3-12L1, . . . , 1nL3-1nL1, . . . , 3nL3-3nL1 to electrically connect to each of the electrodes 125 in the row, wherein p, m, n are each an integer.

Referring to FIGS. 4A to 4C, FIGS. 5A to 5F and FIG. 6, the first row electrodes 601 have the horizontal line signals of "001", which represents the electrodes 125 of the first row electrodes 601 are electrically connected to the corresponding the first vertical lines 11L1, 12L1, . . . , 1nL1, . . . , 3nL1, respectively. The second row electrodes 602 have horizontal line signals of "010", which represents the electrodes 125 of the second row electrodes 602 are electrically connected to the corresponding second vertical lines 11L2, 12L2, . . . , 1nL2, . . . , 3nL2, respectively. The third row electrodes 603 have horizontal line signals of "100", which represents the electrodes 125 of the third row electrodes 603 are electrically connected to the corresponding third vertical lines 11L3, 12L3, . . . , 1nL3, . . . , 3nL3, respectively.

Figure 7:
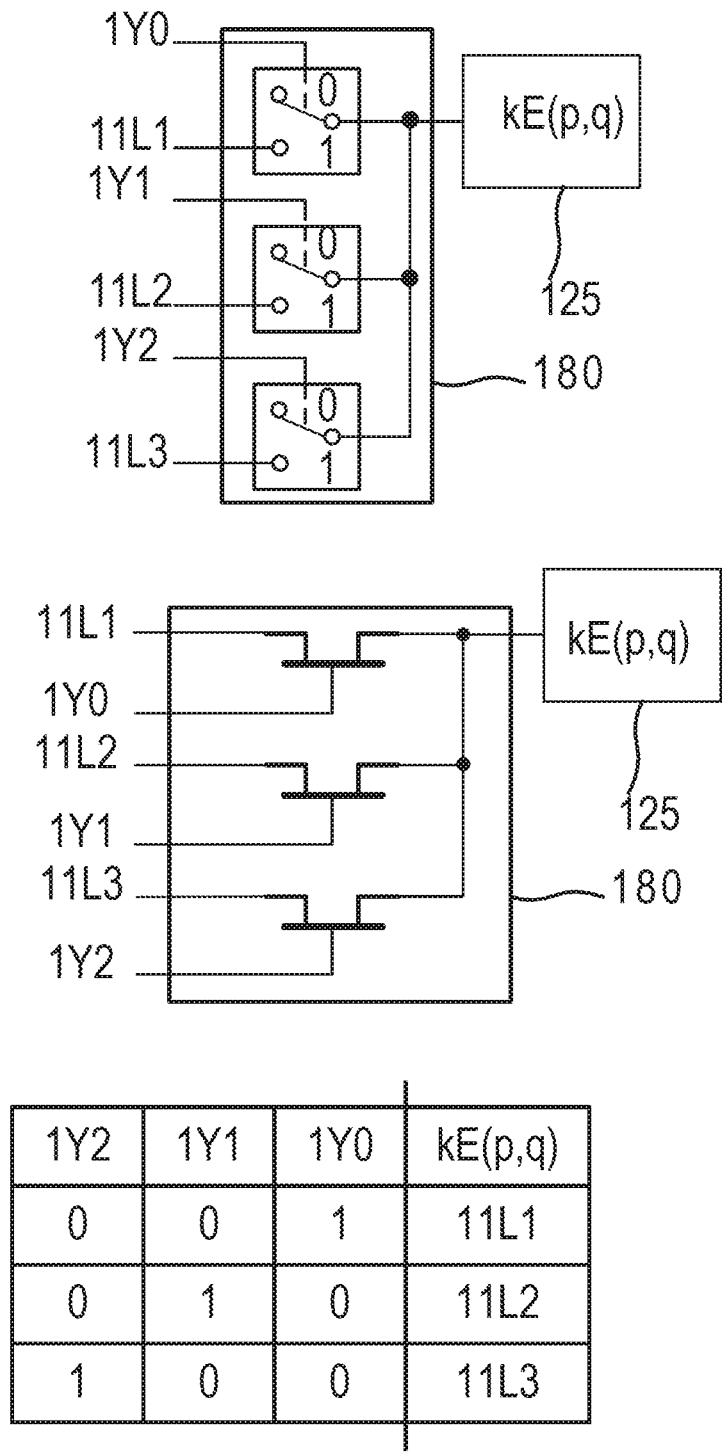
FIG. 7 is the circuit diagram of the electrode selection switch group according to the present invention.

FIG. 7 is the circuit diagram of the electrode selection switch group 180 according to the present invention. In the present invention, all of the electrode selection switch groups 180 have the same circuit structure. FIG. 7 shows a schematic circuit diagram of a electrode selection switch group 180, a corresponding transistor circuit and a corresponding truth table. The horizontal lines 1Y2-1Y0 are of "001", which represents the corresponding electrodes 125 are electrically connected to the first vertical line 11L1. The horizontal lines 1Y2-1Y0 are of "010", which represents the corresponding electrodes 125 are electrically connected to the second vertical line 11L2. The horizontal lines 1Y2-1Y0 are of "100", which represents the corresponding electrodes 125 are electrically connected to the third vertical line 11L3, and so on. That is, the electrode selection switch group 180 uses one-hot encoding.

The higher bits (bit4, bit3) of the respective electrode 180 are corresponding to two control signal lines 11X1-11X0, 12X1-12X0, . . . , 1nX1-1nX0, . . . , 3nX1-3nX0, respectively, to control the vertical lines 11L3-11L1, 12L3-12L1, . . . , 1nL3-1nL1, . . . , 3nL3-3nL1 to electrically connect to the sensing stimulating signal S1, S2, S3, the deflection focusing signal R1 or the convergence stabilizing signal R2, respectively. As shown in FIGS. 4A to 4C and 6, the control signal 11X1-11X0, 12X1-12X0, . . . , 1nX1-1nX0, . . . , 3nX1-3nX0 each has two bits, so it can form four states. In the embodiment in FIG. 4, each group of the vertical lines 11L3-11L1, 12L3-12L1, . . . , 1nL3-1nL1, . . . , 3nL3-3nL1 only has three vertical lines and three signal lines S1, R1, R2. Thus, only three state, State 0, State 1, State 2 are needed.

Figure 4A:
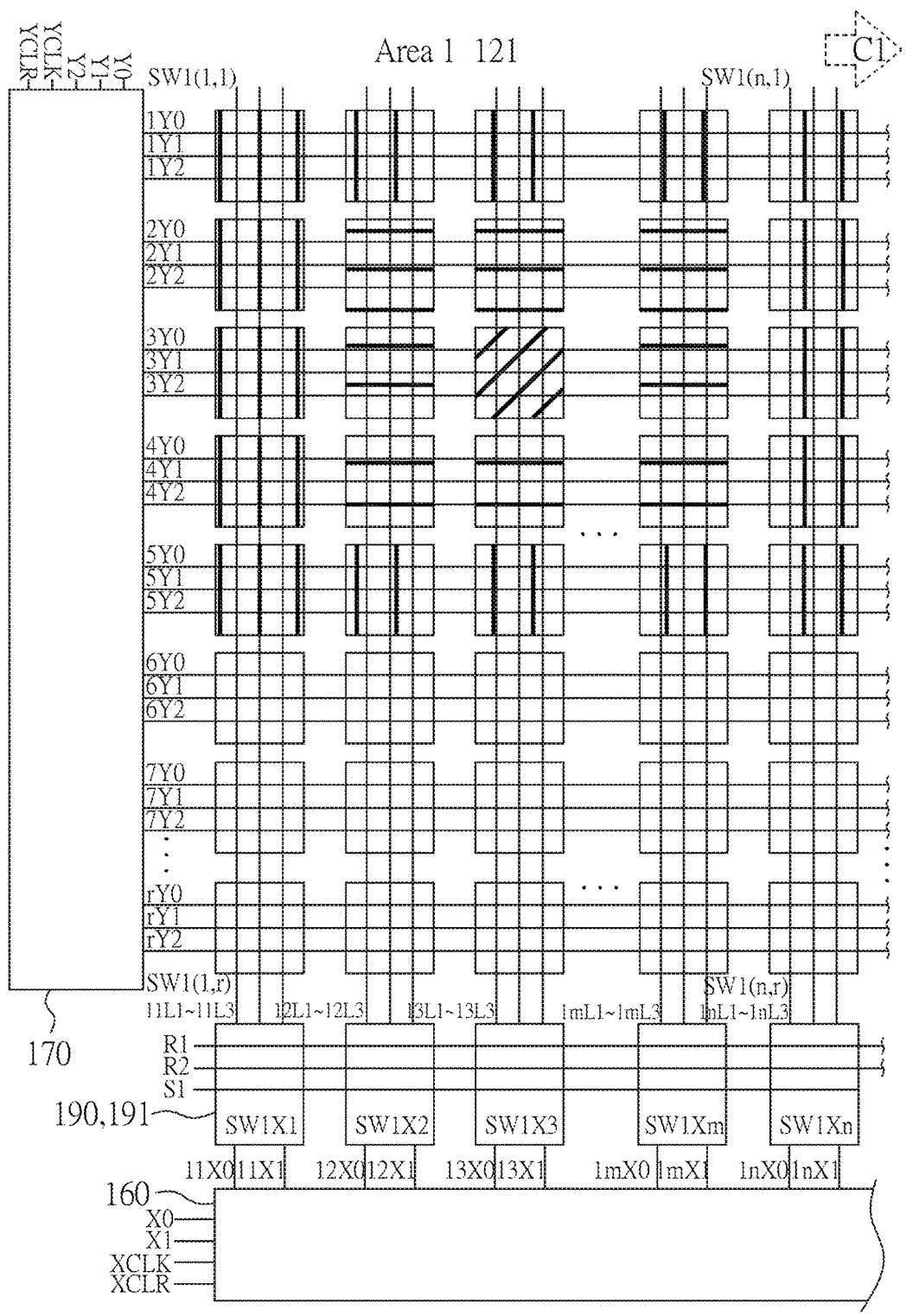
Figure 4B:
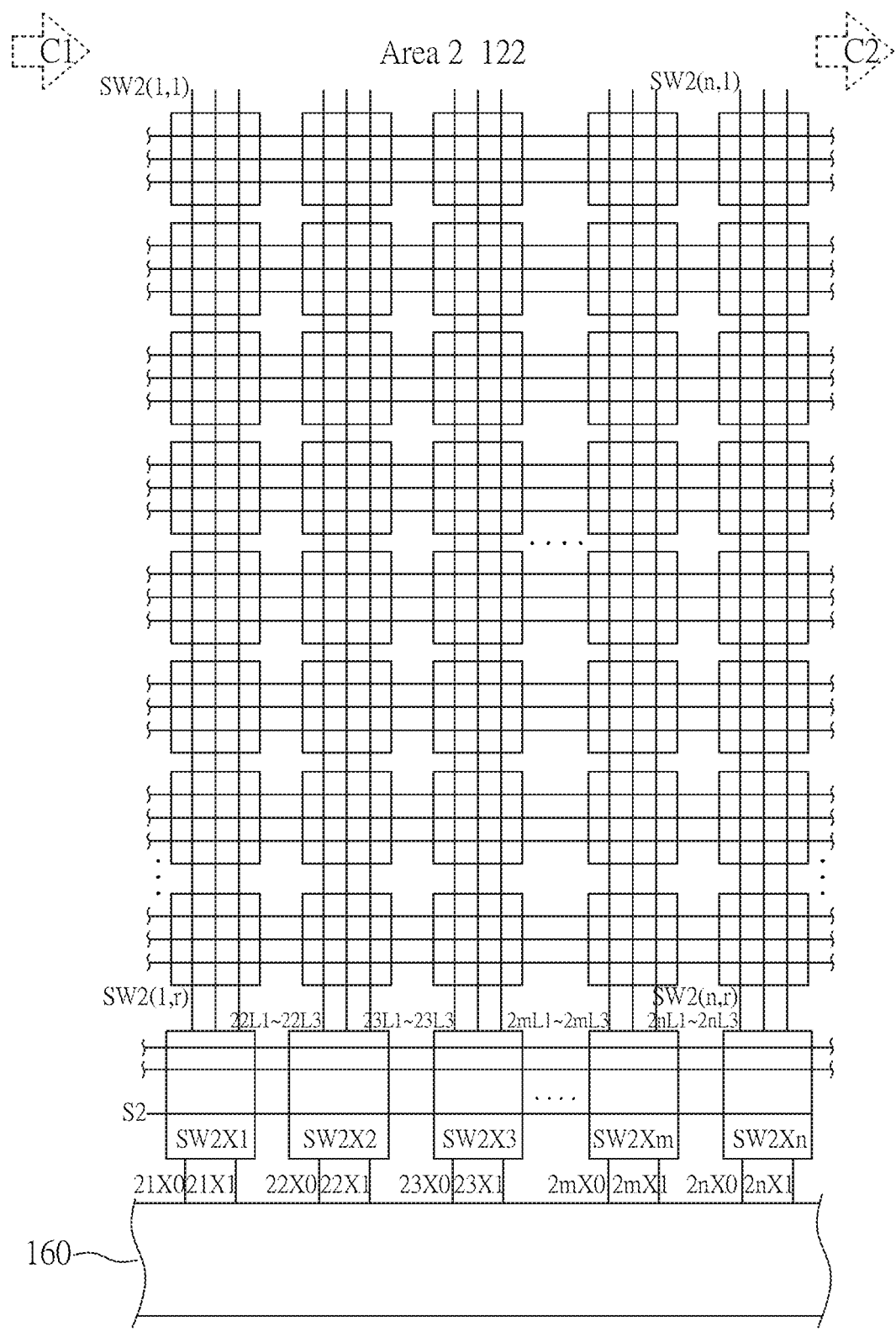
Figure 4C:
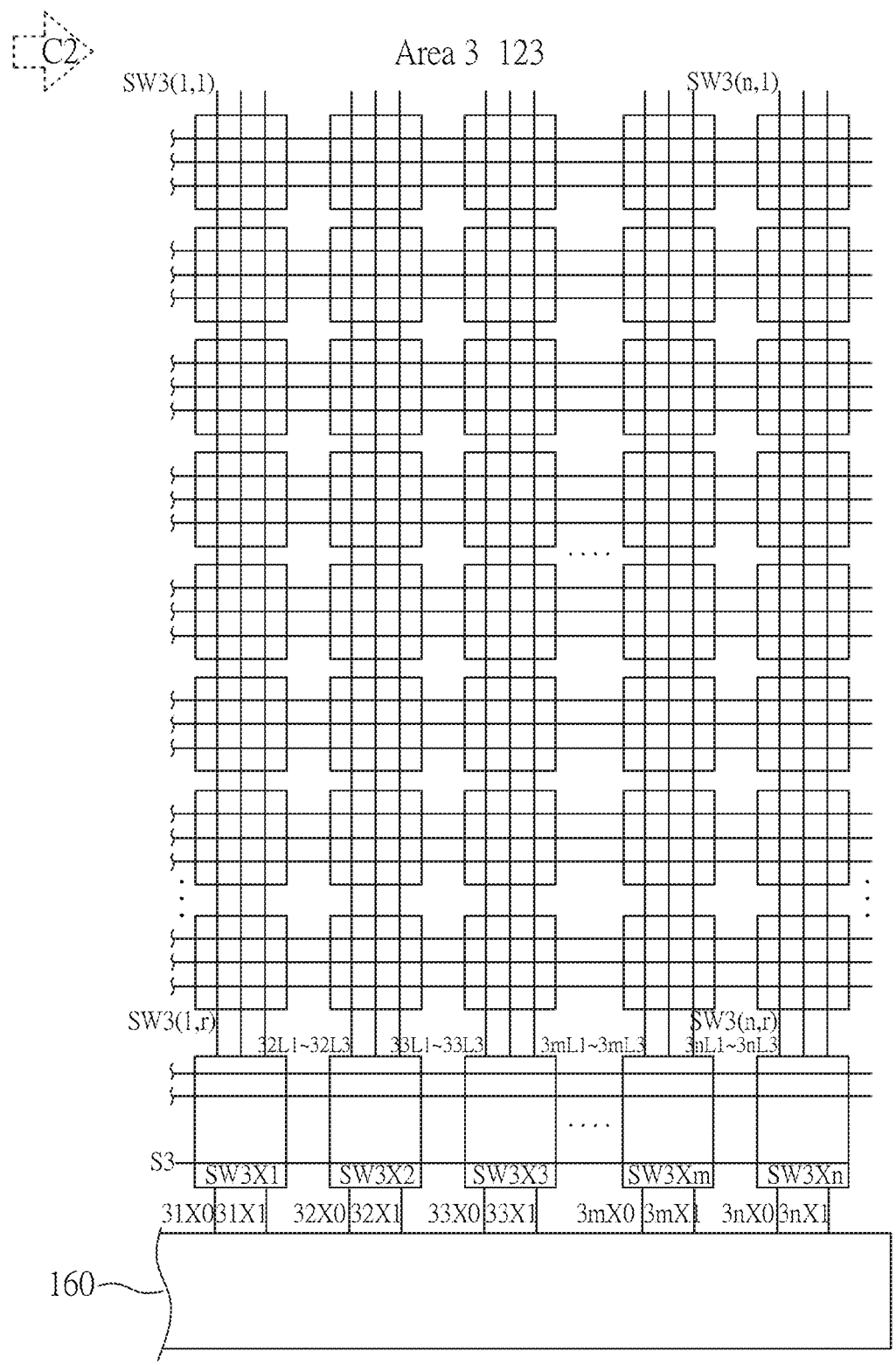
Figure 8:
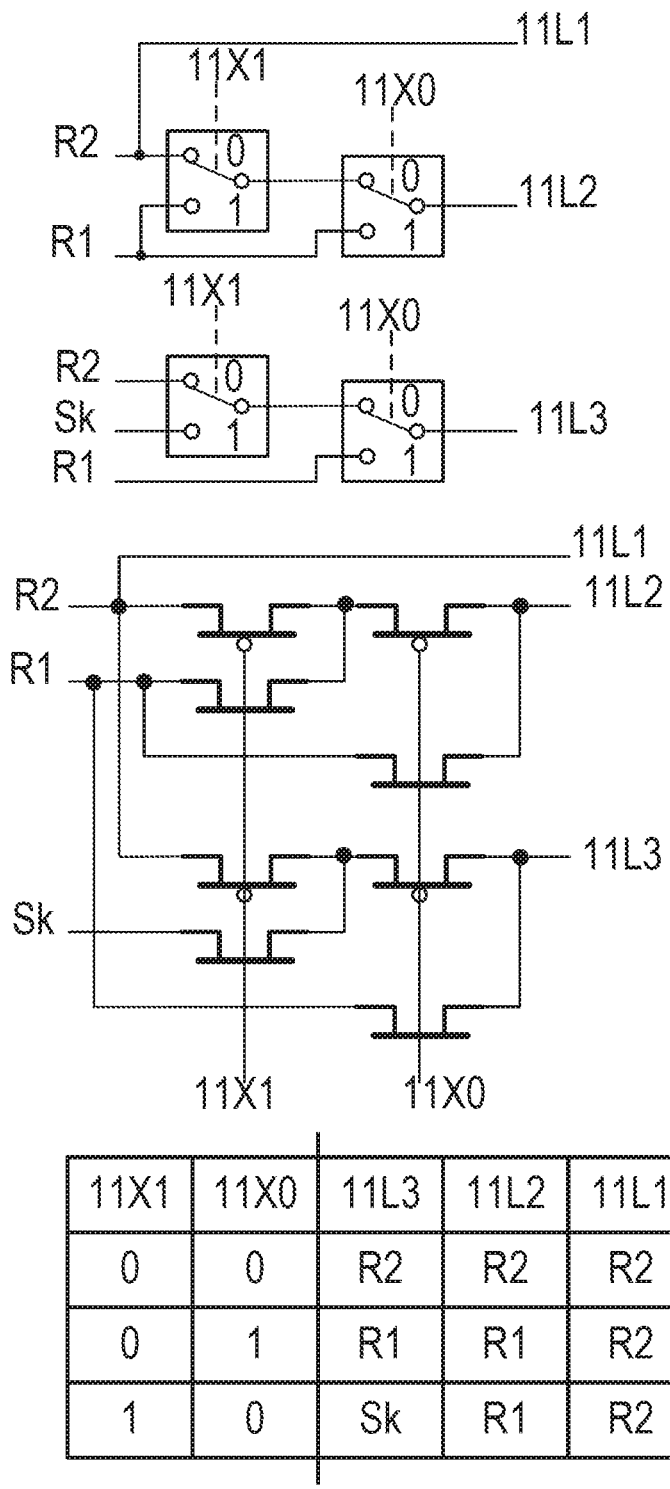
FIG. 8 is the circuit diagram of the sensing and deflection signal selection switch group according to the present invention.

FIG. 8 is the circuit diagram of the sensing and deflection signal selection switch group 190 according to the present invention. In FIG. 4A to 4C, the sensing and deflection signal selection switch groups 190 and 191 have the same circuit structure. However, in the following drawings, the sensing and deflection signal selection switch groups have different circuit structures. FIG. 8 shows the circuit diagram of the sensing and deflection signal selection switch group 191, the corresponding transistor circuit and the corresponding truth table. State 0, State 1, State 2 control the sensing and deflection signal selection switch group 191, and further control the connection between the vertical lines and the signal line.

In State 0(00b), the vertical line 11L1 is connected to the signal line R2, the vertical line 11L2 is connected to the signal line R2, and the vertical line 11L3 is connected to the signal line R2. In State 1(01b), the vertical line 11L1 is connected to the signal line R2, the vertical line 11L2 is connected to signal line R1, and the vertical line 11L3 is connected to the signal line R1. In State 2(10b), the vertical line 11L1 is connected to the signal line R2, the vertical line 11L2 is connected to the signal line R1, and the vertical line 11L3 is connected to the signal line Sk, wherein the signal Sk is S1, S2, S3.

By the aforementioned control method, the sensing area composed of the electrode marked "S" is connected to the sensing stimulating signal Sk. The deflection focusing area composed of the electrode marked "R1" is connected to the deflection focusing signal R1. The convergence stabilizing area composed of the electrode marked "R2" are connected to the convergence stabilizing signal R2. The deflection focusing signal R1 and the convergence stabilizing signal R2 are in-phase or inverted to the sensing stimulating signal Sk in the sensing area or specific voltages; the specific voltage can be zero voltage, positive voltage, negative voltage or AC voltage.

The control circuit 200 sets the first sensing and deflection electrode configuration circuit 160 and the second sensing and deflection electrode configuration circuit 170 to control the electrode selection switch groups 180 and sensing and deflection signal selection switch groups 190, as shown in FIGS. 5A and 5F, to shift the position of the selected sensing electrode block and the deflection electrode blocks thereof along the first direction or the second direction.

Figure 9A:
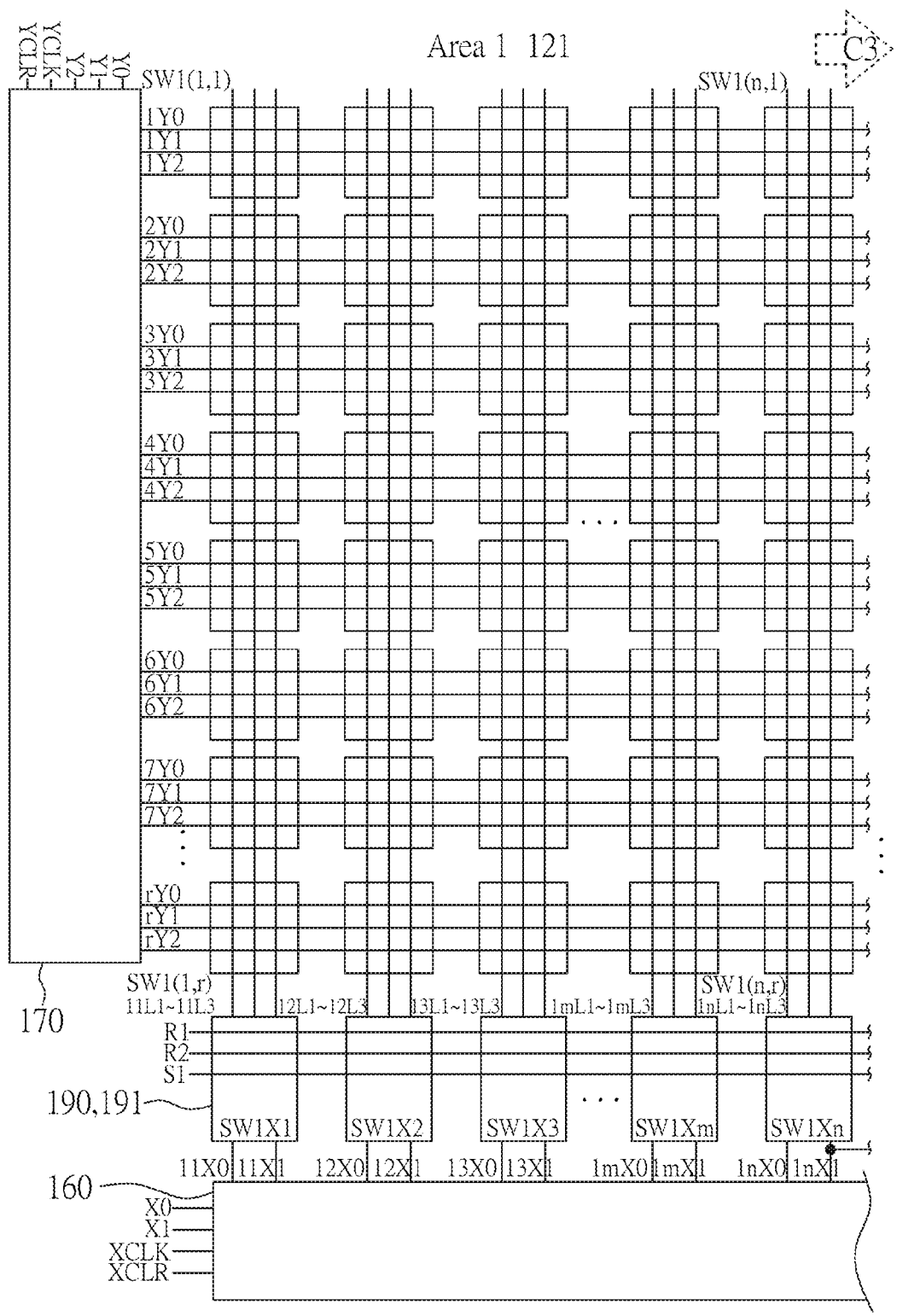
Figure 9B:
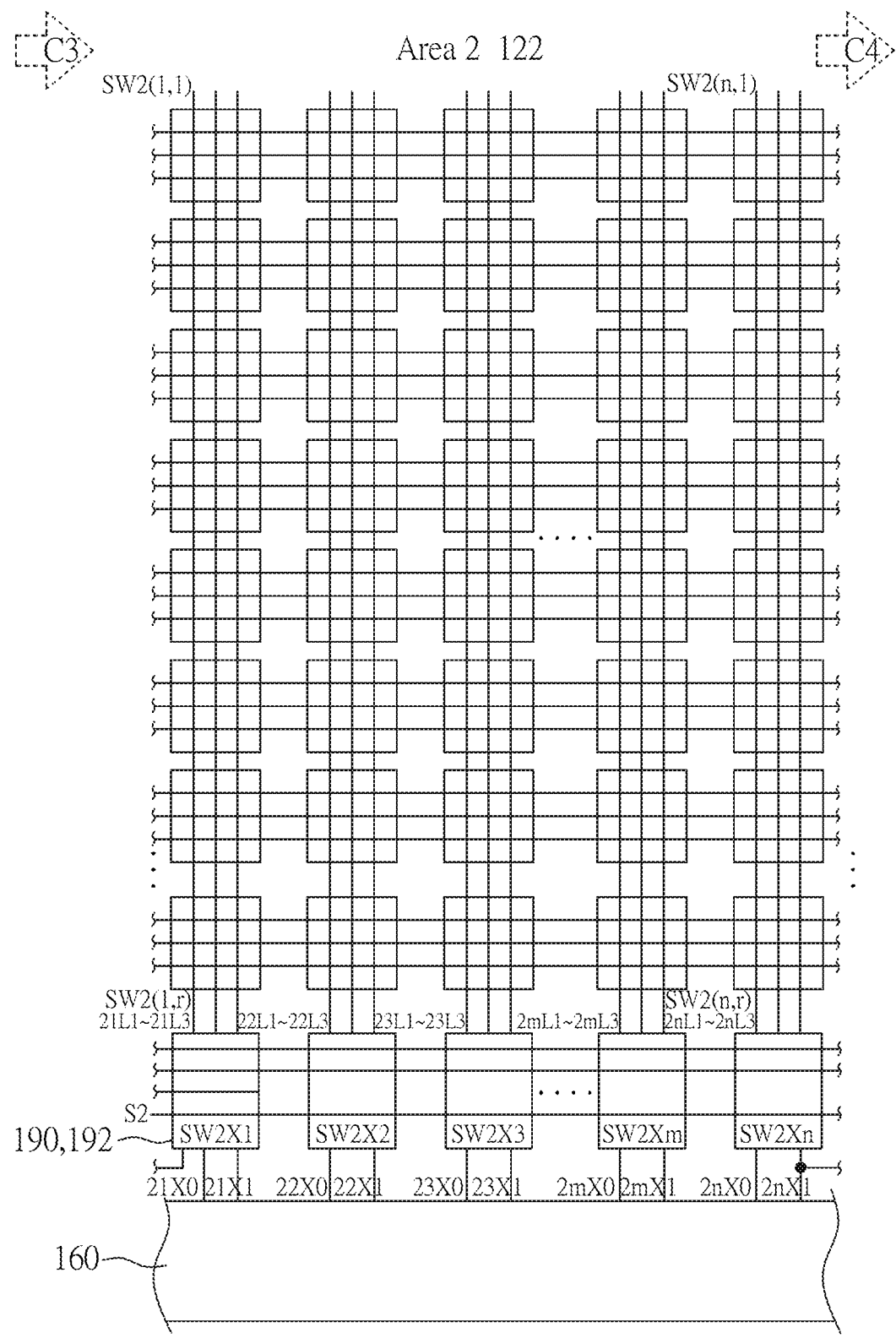
Figure 9C:
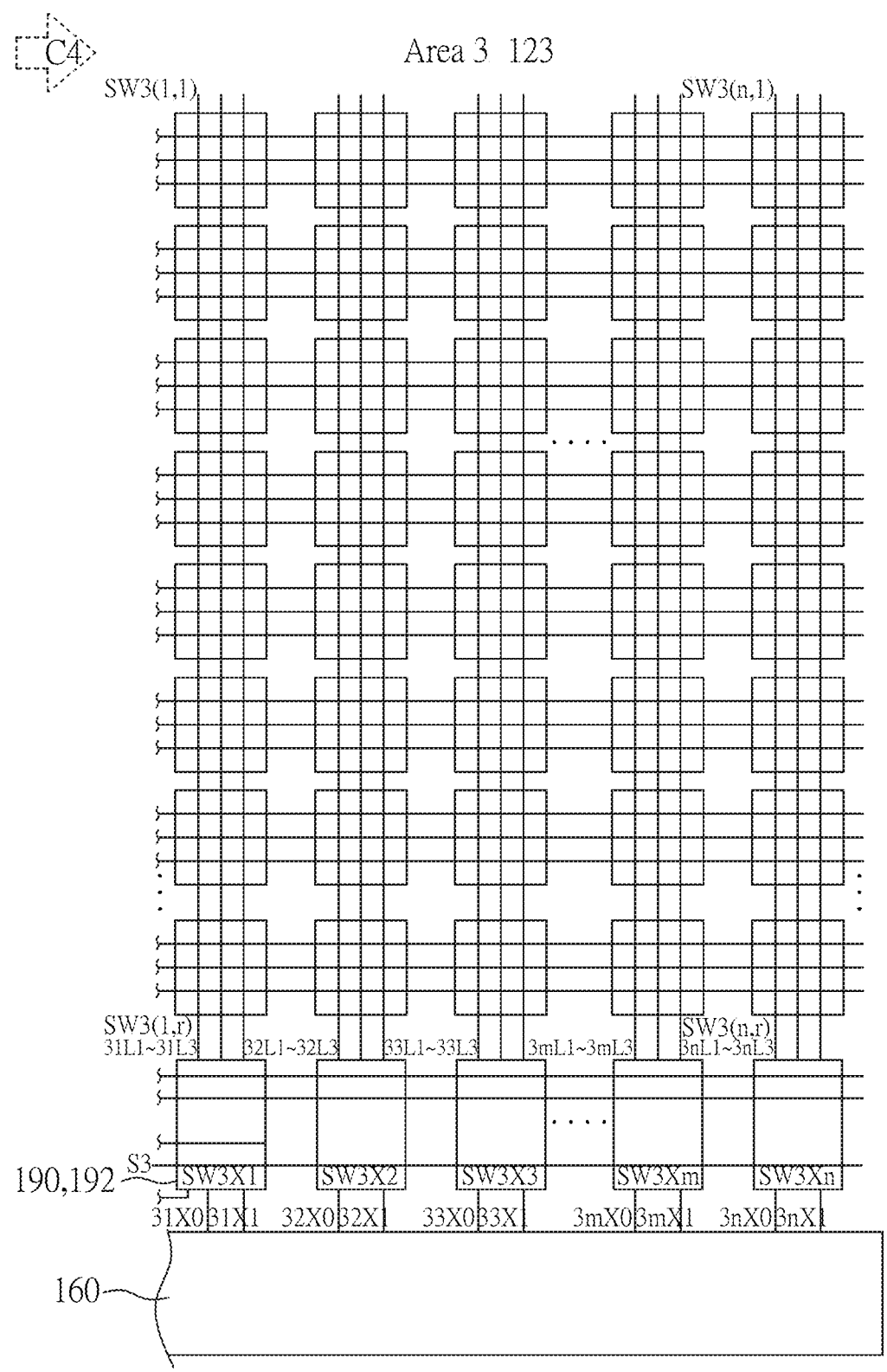

FIGS. 9A to 4C and FIGS. 10A to 10F illustrate another operation of the fingerprint identification according to the present invention. In FIG. 9, the electrodes 125 on the substrate 110 are divided into a plurality of electrode areas 121, 122, 123, . . . . The electrodes 125 in the respective electrode area 121, 122, 123, . . . can be divided into three areas, which are a sensing area, a deflection focusing area and a convergence stabilizing area. FIGS. 9A to 9C are similar to FIGS. 4 A to 4C except that: the sensing stimulating signal line S1 in the electrode area 121 extends to the electrode area 122, the sensing stimulating signal line S2 in the electrode area 122 extends to the electrode area 123, and so on.

Figures 10A, 10B:
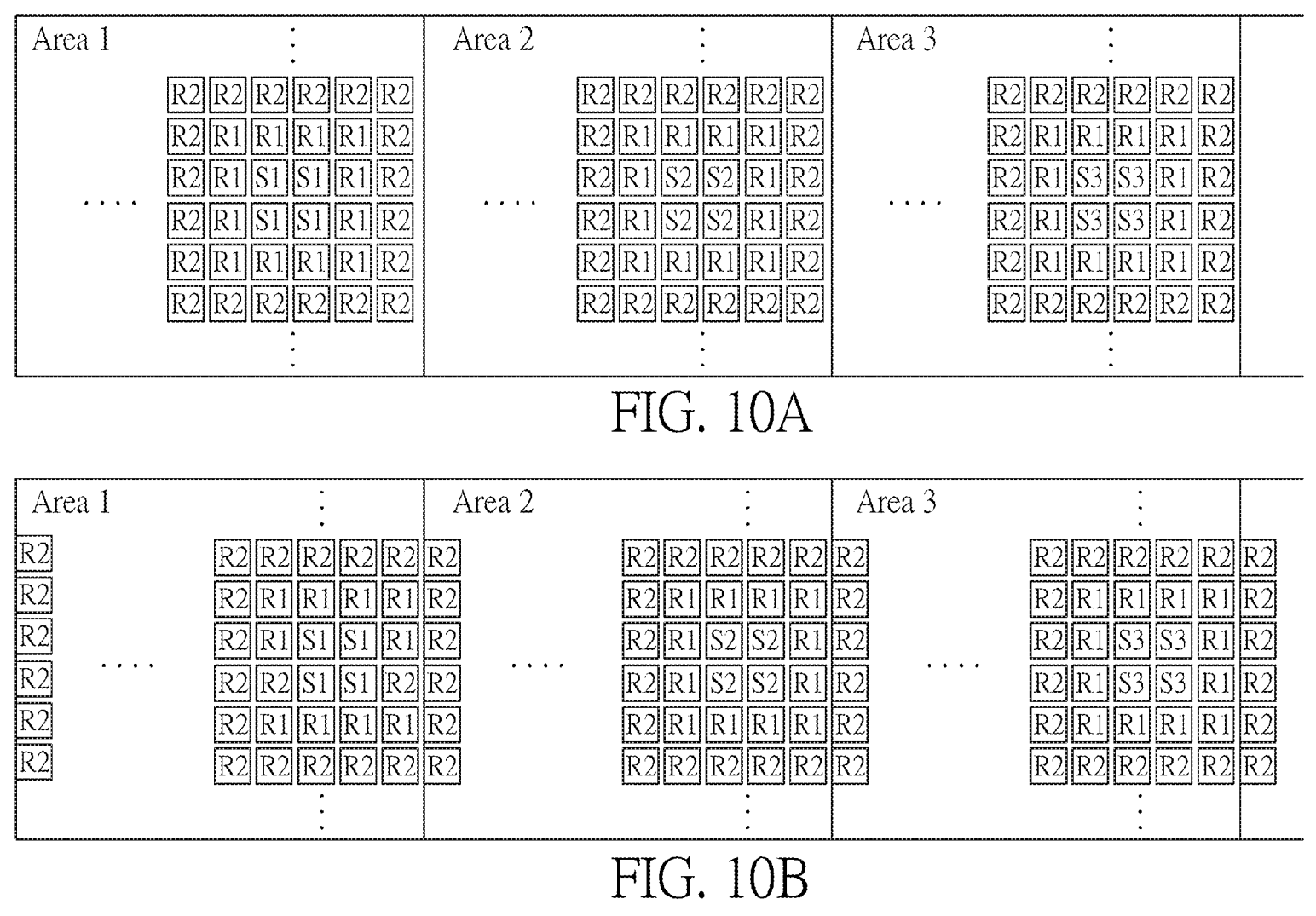
Figures 10C, 10D:
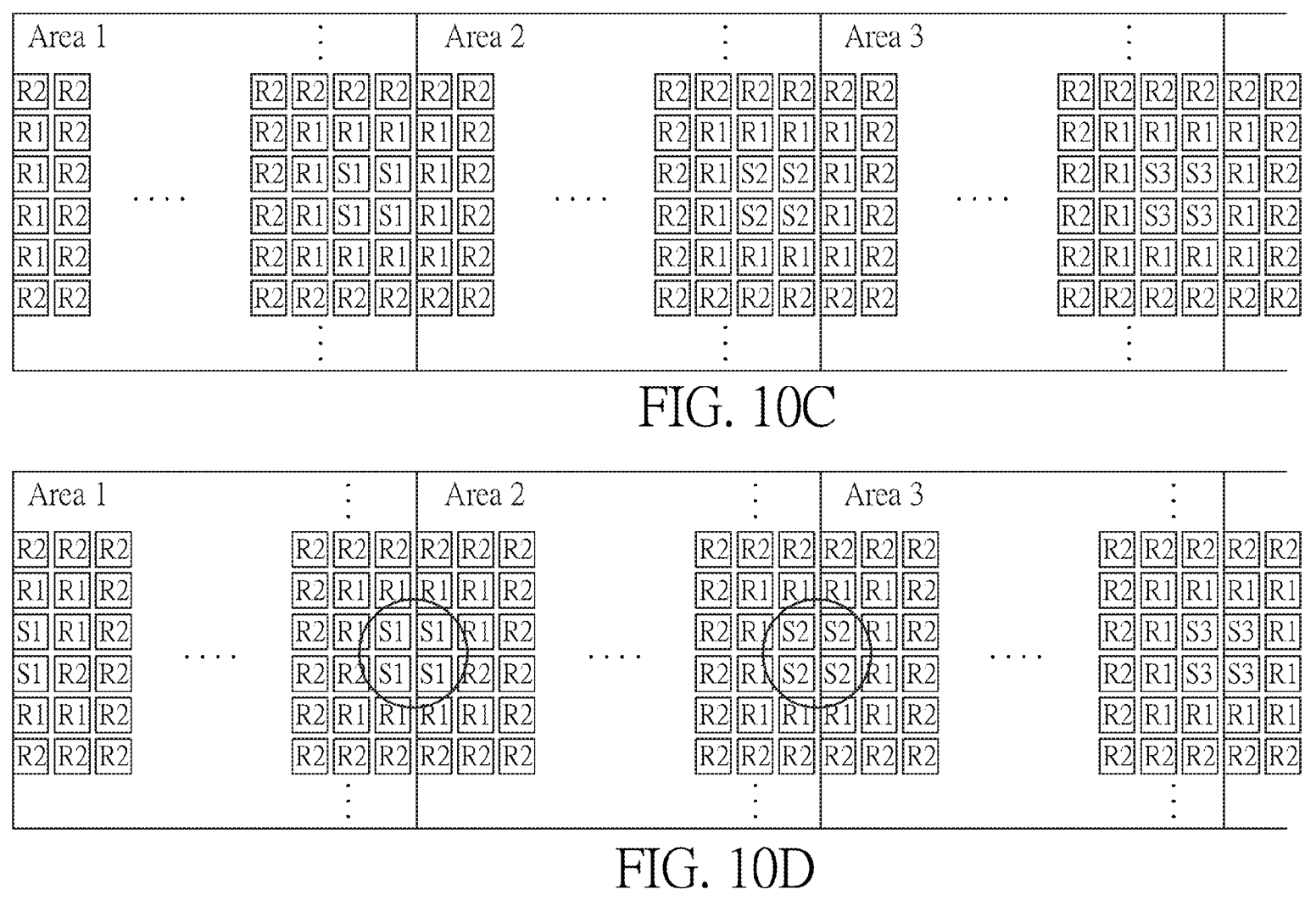
Figures 10E, 10F:
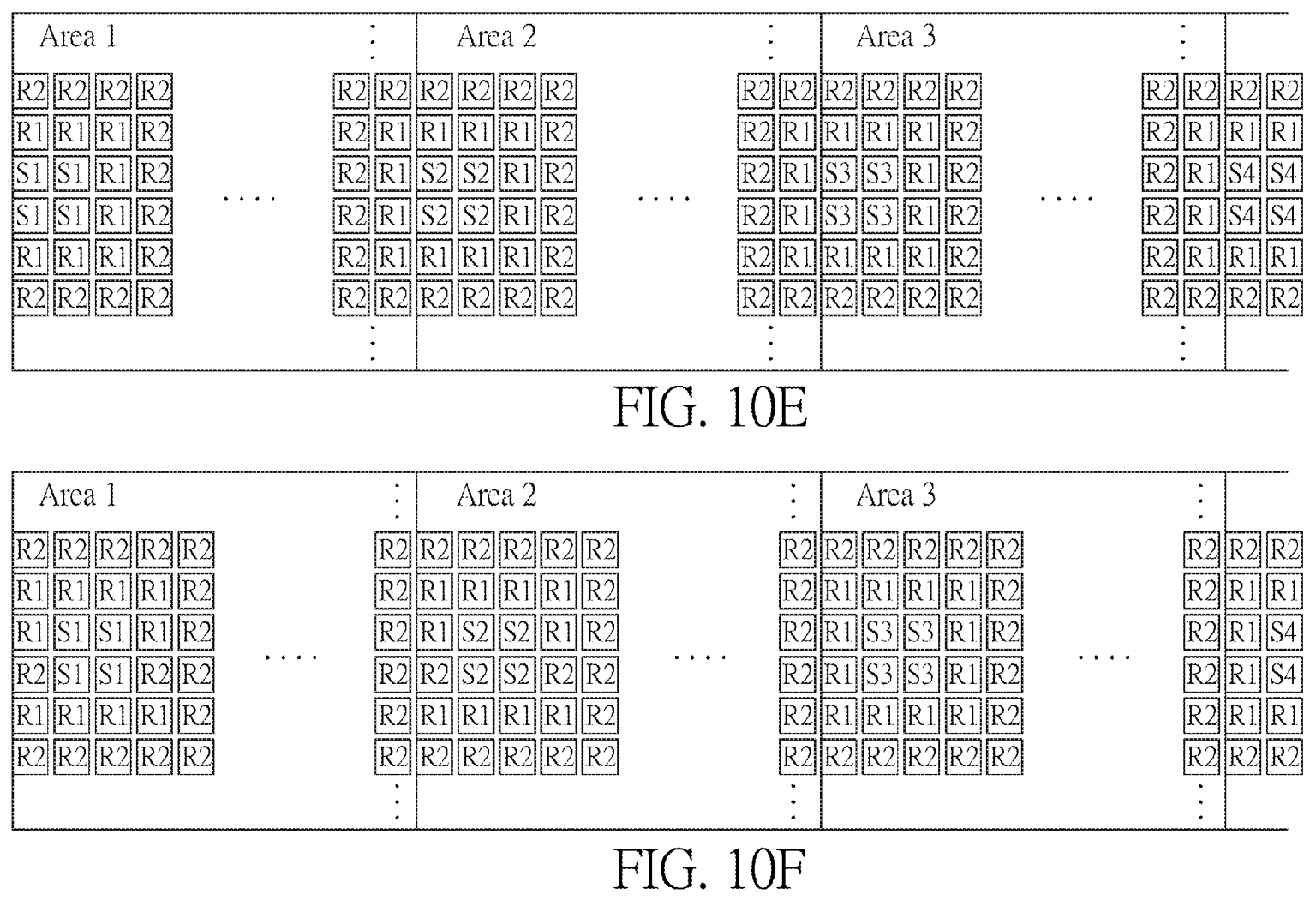

FIGS. 10A to 10F are similar to FIGS. 5A to 5F except that: in FIGS. 5A to 5F, the sensing area only includes an electrode, while in FIGS. 10A to 10F, the sensing area includes four electrodes. As shown in FIG. 10A, the electrode area group composed of the sensing area, the deflection focusing area and the convergence stabilizing area is located in the border between the electrode area 1 and the electrode area 2. As shown in FIG. 10B, the position of the electrode area group shifts across the border between the electrode area 1 and electrode area 2 for over an electrode size. As shown in FIG. 10C, it shifts across for over two electrode sizes, and so on. It is noted that, as shown in FIG. 10D, the electrodes 125 in the sensing area are originally applied with the sensing stimulating signal S1. When it shifts across into the electrode area 2 for an electrode size, they are still applied with the sensing stimulating signal S1. As shown in FIG. 10E, the electrodes 125 in the sensing area are originally applied with the sensing stimulating signal S1. When all of the electrodes 125 in the sensing area shift across into the electrode area 2 (for two electrode sizes), they are applied with the sensing stimulating signal S2 instead. The electrodes 125 in the electrode area group originally located in the border between the electrode area 2 and the electrode area 3 shift in a similar way.

To achieve the function in FIGS. 10A to 10F, the sensing and deflection signal selection switch group 190 in FIG. 9A to 9C includes two types: one type is sensing and deflection signal selection switch group 190 (191), which has the same circuit of the sensing and deflection signal selection switch group 191 in FIG. 8. Another type is shown in FIG. 11. FIG. 11 is the truth table of the sensing and deflection signal selection switch group 190, 192 according to the present invention. A truth table in general form is shown in top of FIG. 11. The sensing and deflection signal selection switch group 192 in FIG. 9 is corresponding to k=2. The truth table for the sensing and deflection signal selection switch group 192 is derived with k=2, j=1 substituted into the top truth table. The circuit thereof can be designed according to the truth table by digital logic design.

Similarly, for the sensing and deflection signal selection switch group 192 in the electrode area 3 and near the electrode area 2, the truth table for the sensing and deflection signal selection switch group 192 in the electrode area 3 and near the electrode area 2 is derived with k=3, j=2 substituted into the top truth table. It has the same truth table as FIG. 11 and the same circuit structure.

Figure 12A:
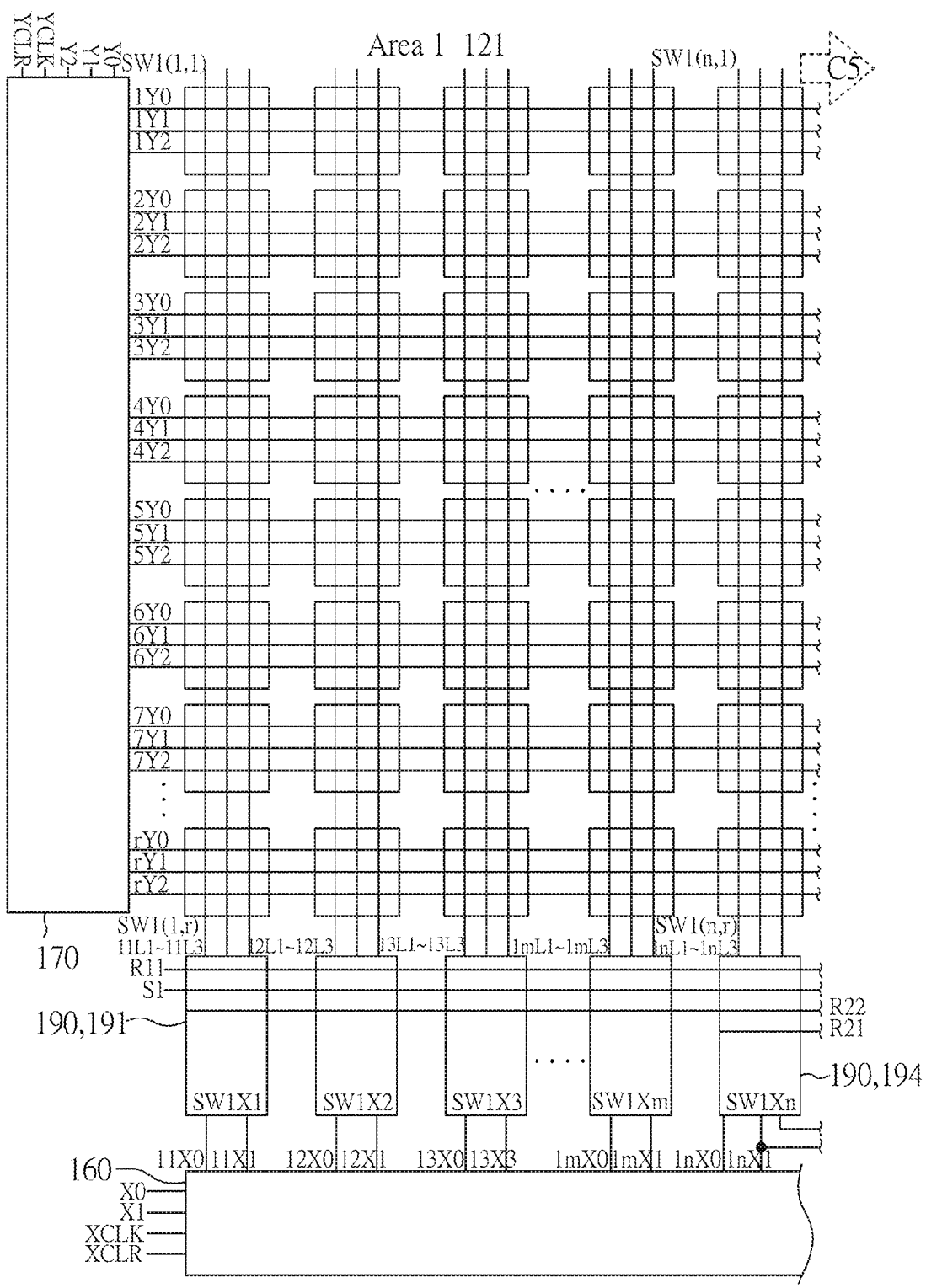
Figure 12B:
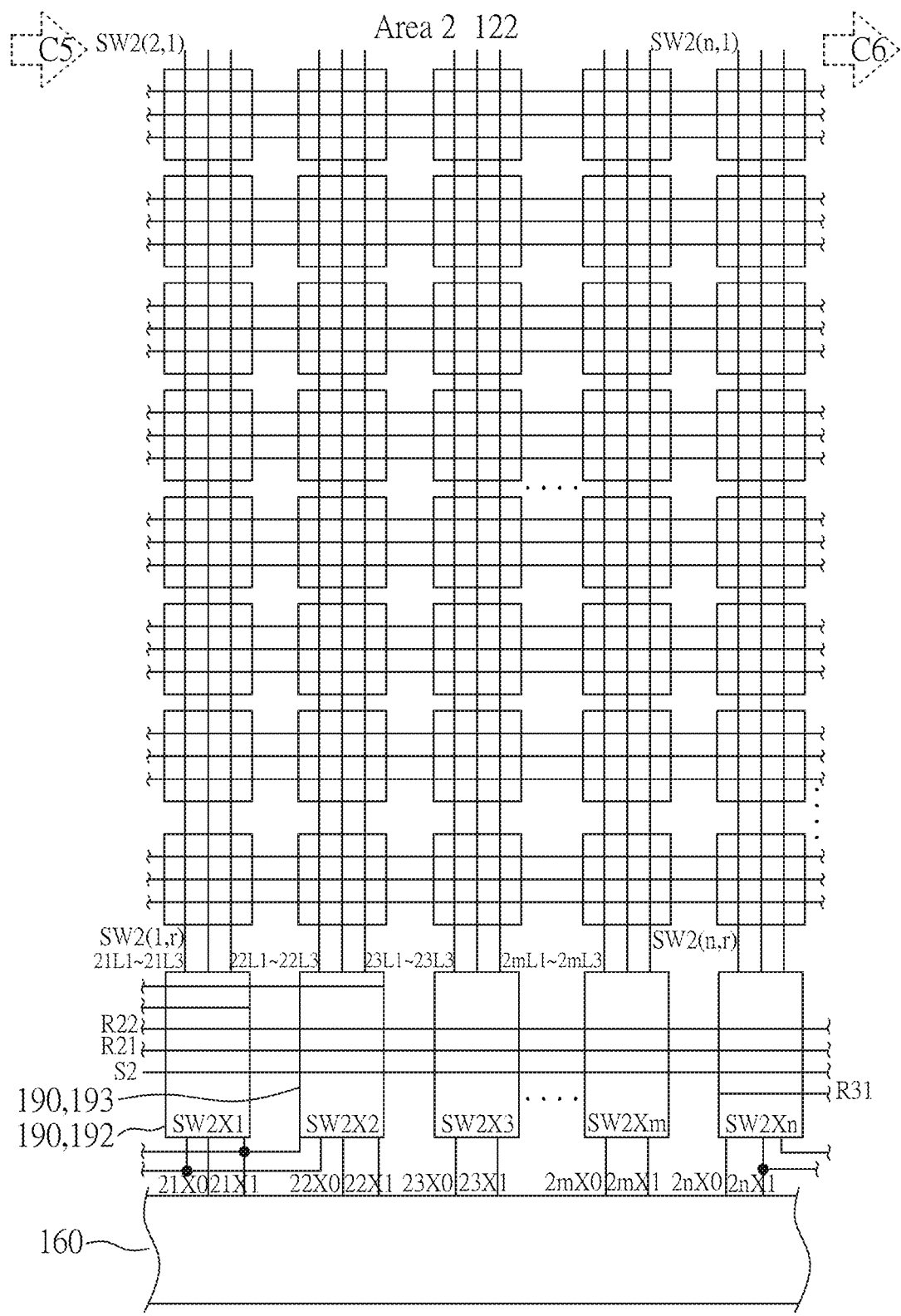
Figure 12C:
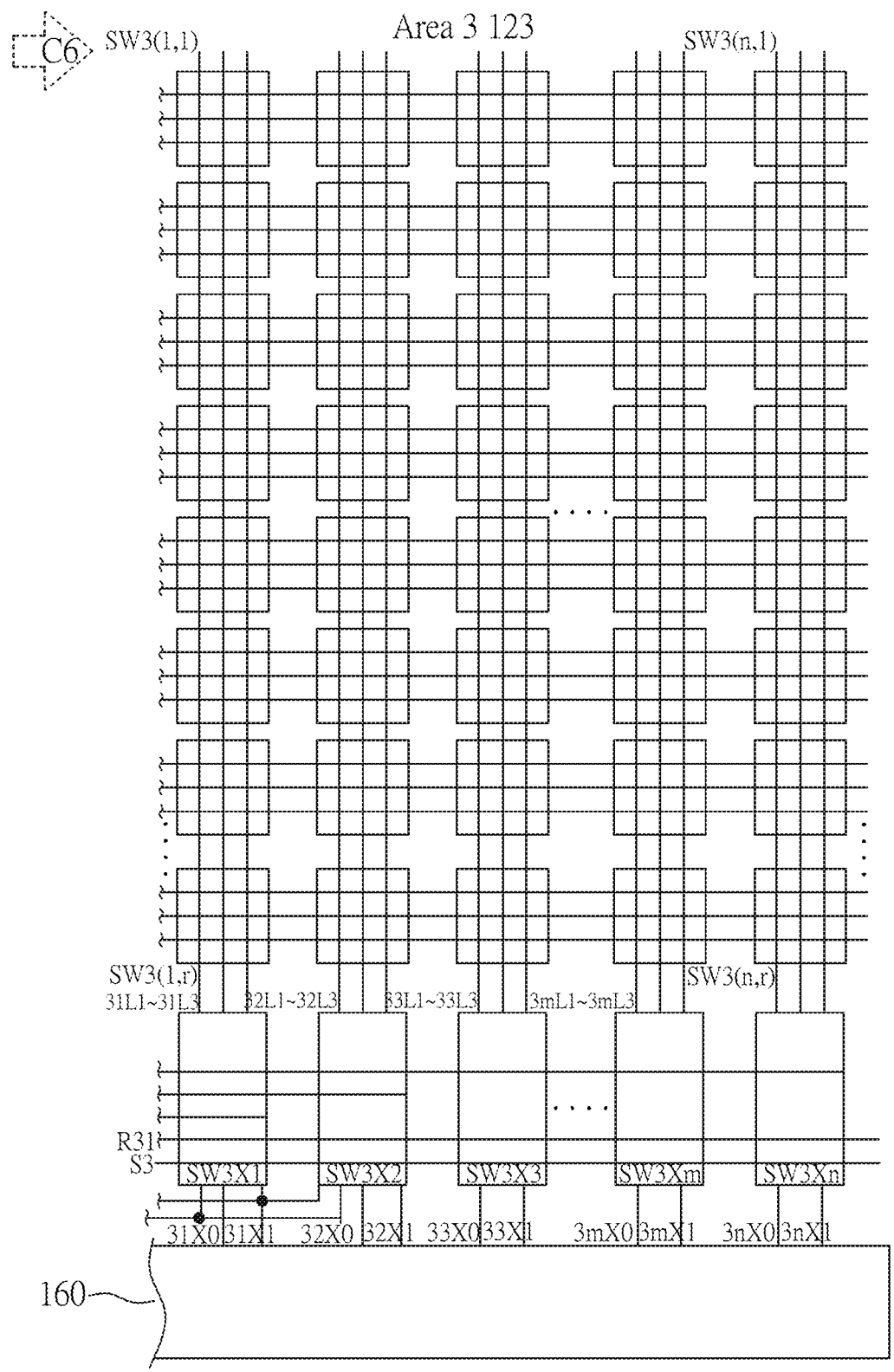

FIGS. 12A to 12C, FIGS. 13A to 13F and FIGS. 14A to 14F illustrate still another operation and yet still another operation of the fingerprint identification device according to the present invention. In FIGS. 12A to 12C, the electrodes 125 on the substrate 110 are divided into a plurality of electrode areas 121, 122, 123, . . . . FIG. 12A to 12C are similar to FIGS. 9A to 9C except that: the sensing stimulating signal line S1 in the electrode area 121 extends to the electrode area 122, the sensing stimulating signal line S2 in the electrode area 122 extends to the electrode area 123, and so on. The deflection focusing signal line R11 in the electrode area 121 extends to the electrode area 122, the deflection focusing signal line R21 in electrode area 122 extends to the electrode area 123, and so on. The deflection focusing signal line R21 in the electrode area 122 extends to the electrode area 21, the deflection focusing signal line R31 in electrode area 123 extends to the electrode area 122, and so on.

Figures 13A, 13B:
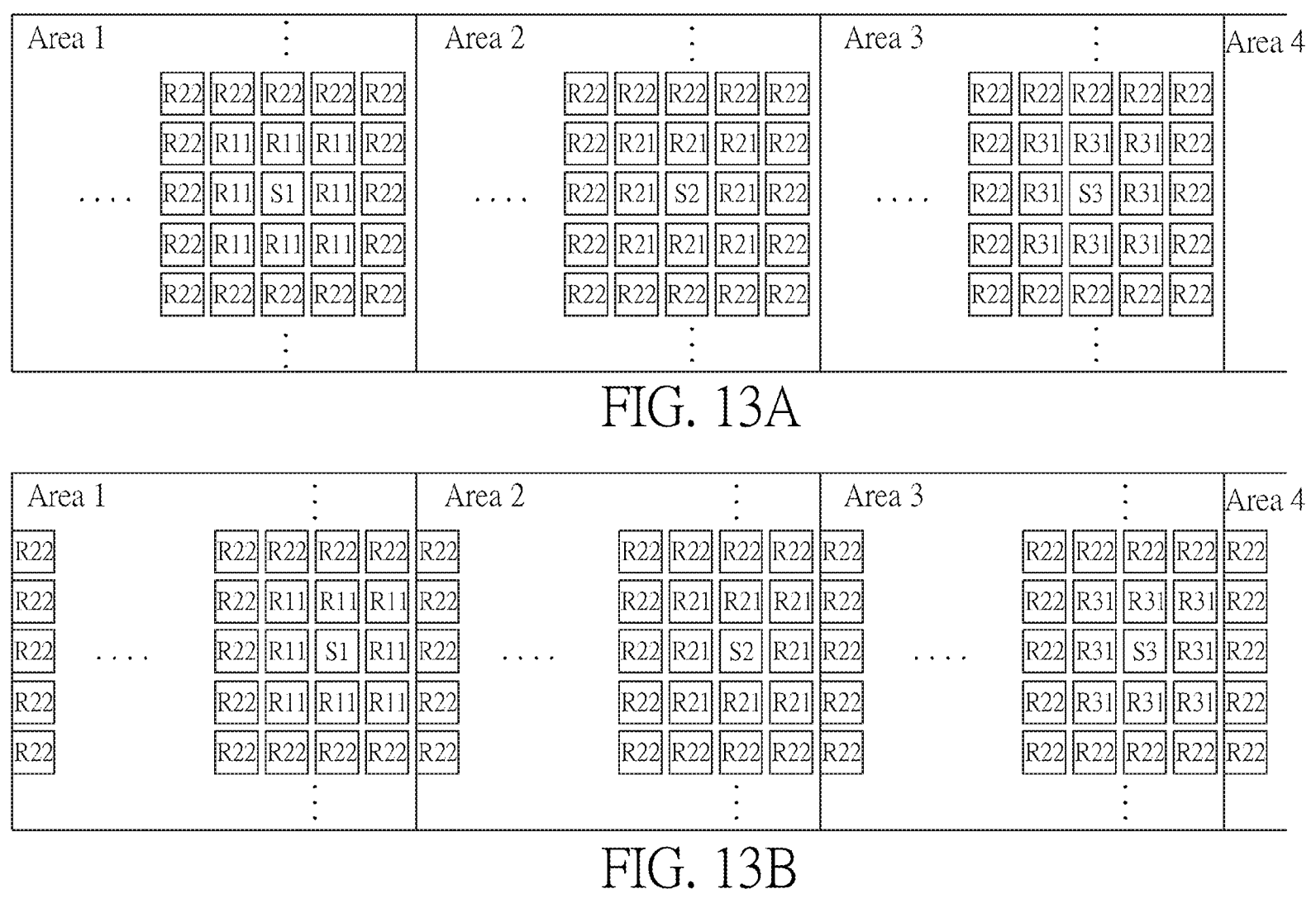
Figures 13C, 13D:
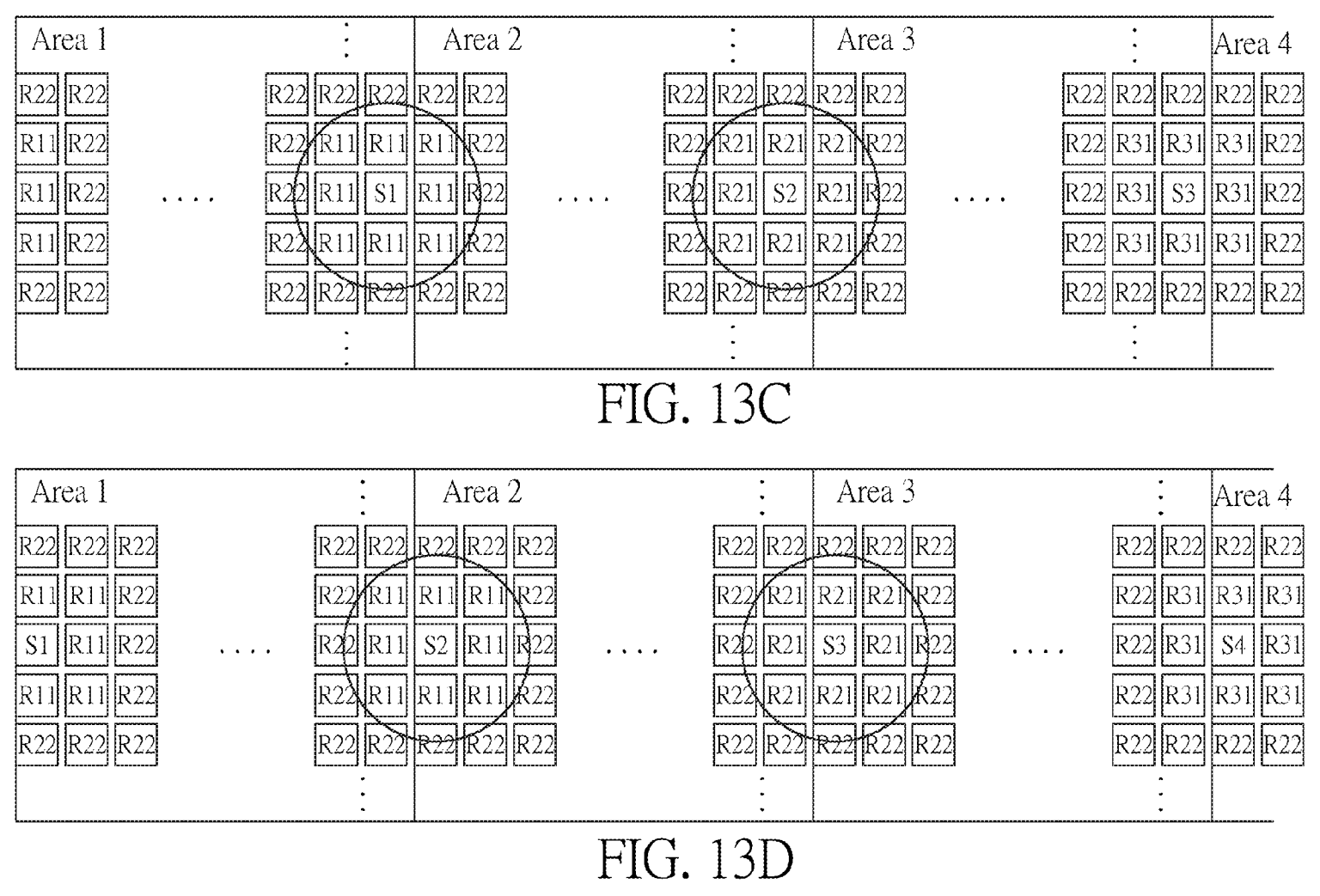
Figures 13E, 13F:
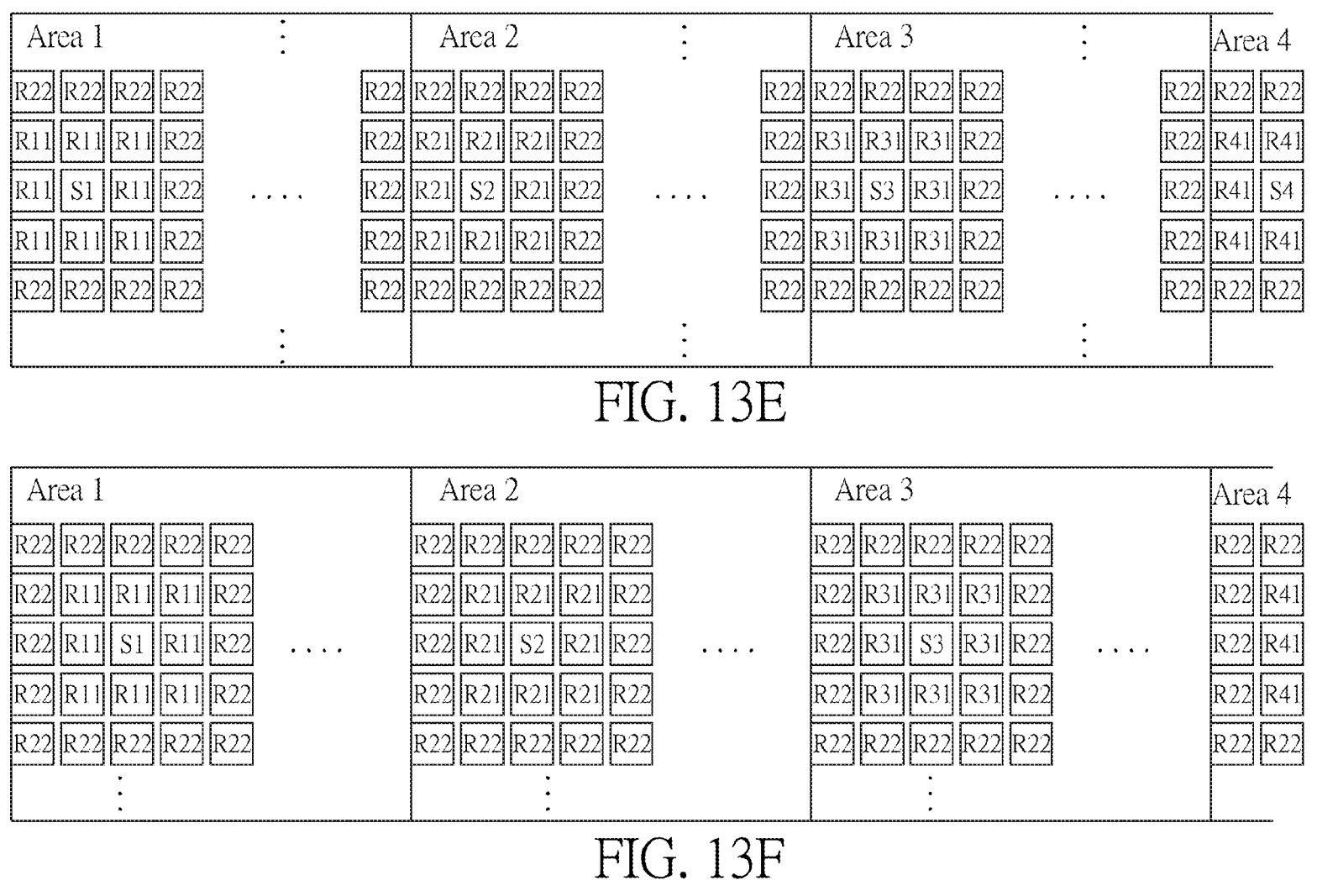

As shown in FIG. 13A, the electrode area group composed of the sensing area, the deflection focusing area and the convergence stabilizing area is located in the border between the electrode area 1 and the electrode area 2. As shown in FIG. 13B, the position of the electrode area group shifts across the border between the electrode area 1 and the electrode area 2 for over an electrode size. As shown in FIG. 13C, it shifts across for over two electrode sizes, and so on. It is noted that, as shown in FIG. 13C, the electrodes in the deflection focusing area in the electrode area group that have shifted across into the electrode area 2 is still applied with the deflection focusing signal line R11 for the electrode area 1. In FIG. 13D, when all of the electrodes in the sensing area in the electrode area group shift across into the electrode area 2, not only the electrodes in the sensing area are applied with the sensing stimulating signal S2 for the electrode area 2 instead, but also all of the electrodes in the deflection focusing area corresponding to the sensing area are applied with the deflection focusing signal R21 for the electrode area 2, although the electrodes in the electrode area 1 in the deflection focusing area are still applied with the deflection focusing signal R21 for electrode area 2. The electrodes in the electrode area group located in the border between the electrode area 2 and electrode area 3 shift in a similar way.

Figures 14A, 14B:
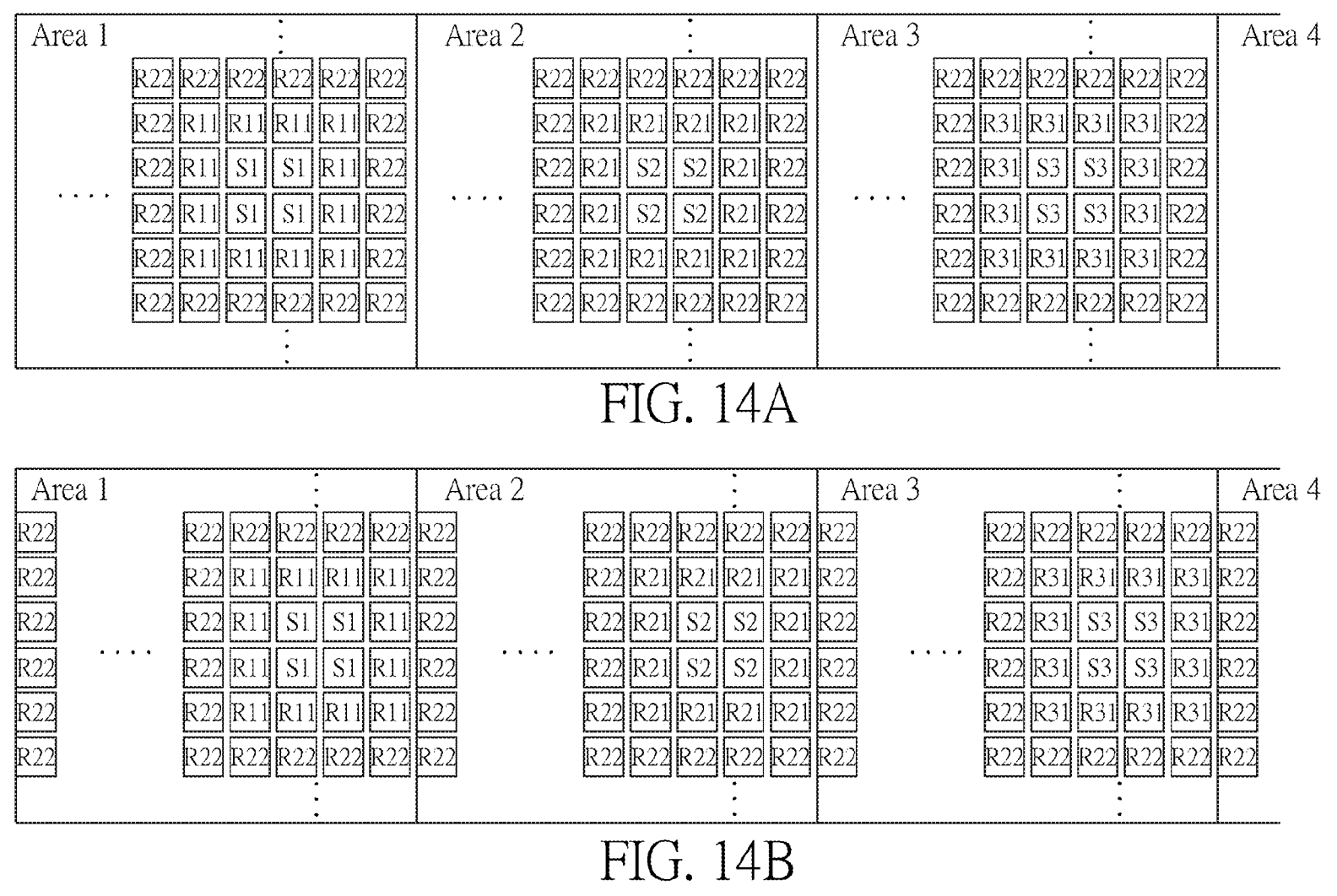
Figures 14C, 14D:
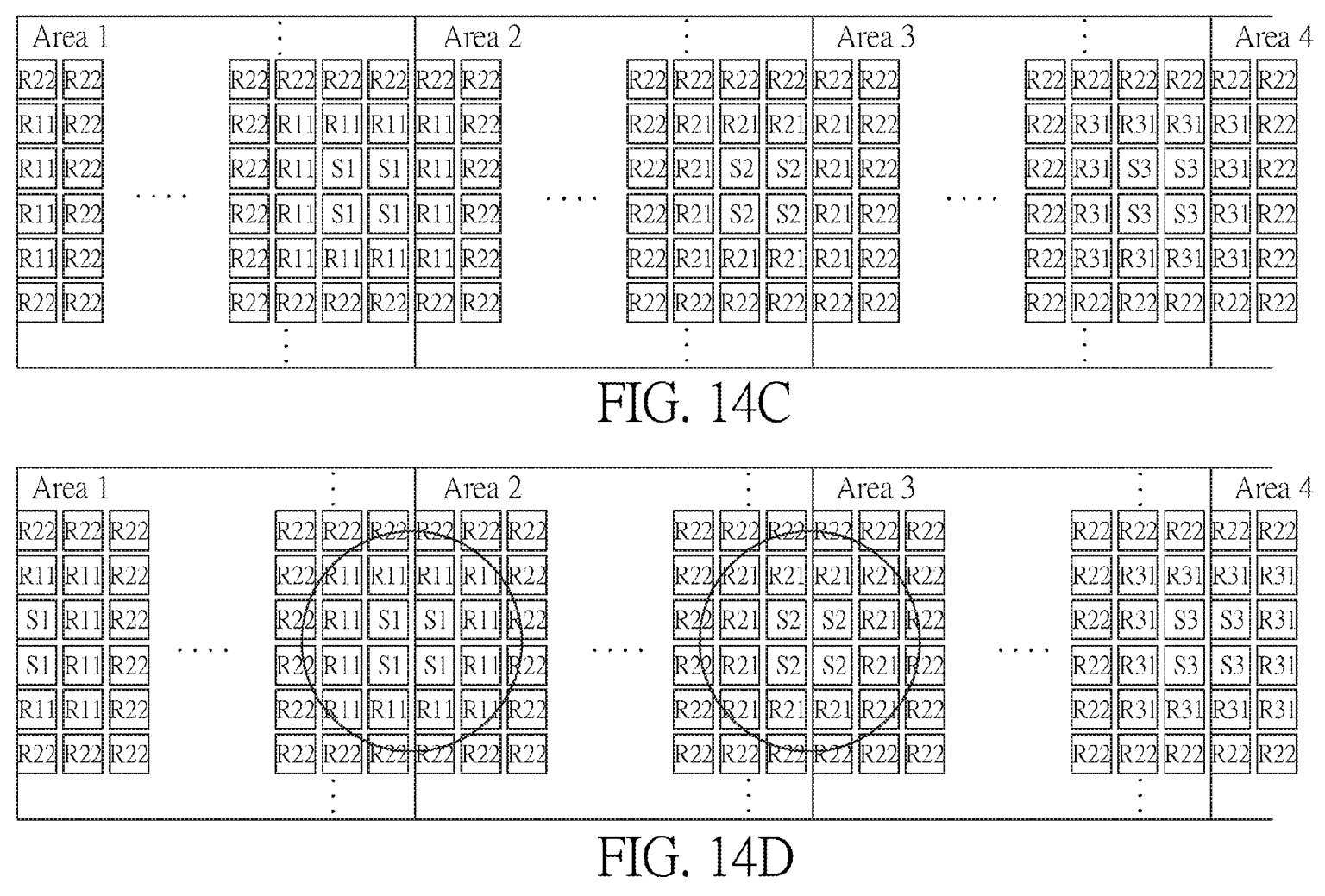
Figures 14E, 14F:
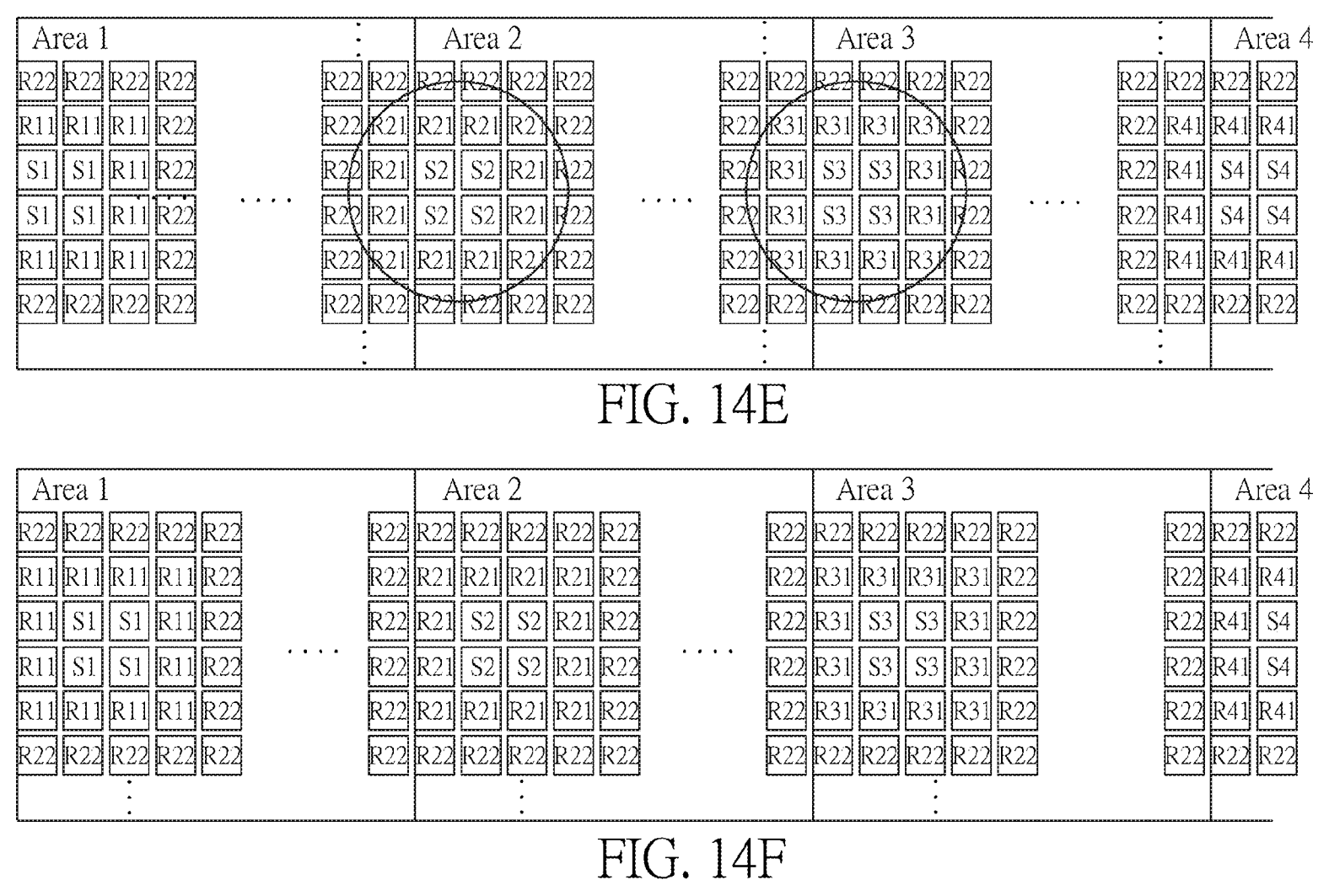

As shown in FIG. 14A, the electrode area group composed of the sensing area, the deflection focusing area and the convergence stabilizing area is located in the border between the electrode area 1 and the electrode area 2. As shown in FIG. 14B, the position of the sensing area, the deflection focusing area and the convergence stabilizing area group shifts across the border between the electrode area 1 and the electrode area 2 for over an electrode size. As shown in FIG. 14C, it shifts across for over two electrode sizes, and so on. It is noted that, as shown FIG. 14D, when half of the electrodes in the sensing area in the electrode area group shift across into the electrode area 2, the electrodes in the deflection focusing area in the electrode area 1 that has shifted across into the electrode area 2 are still applied with the deflection focusing signal R11 for the electrode area 1. In FIG. 14E, when all of the electrodes in the sensing area in the electrode area group shift across into the electrode area 2, all of the electrodes in the deflection focusing area in the electrode area 1 are applied with the deflection focusing signal R21 for the electrode area 2, although the electrodes in the electrode area 1 in the deflection focusing area are still applied with the deflection focusing signal R21 for the electrode area 2. The electrodes in the electrode area group located in the border between the electrode area 2 and the electrode area shift in a similar way.

To achieve the function in FIGS. 13A to 13F and 14A to 14F, the sensing and deflection signal selection switch group 190 in FIGS. 12A to 12C can include four types: a sensing and deflection signal selection switch group 191, a sensing and deflection signal selection switch group 192, a sensing and deflection signal selection switch group 193 and a sensing and deflection signal selection switch group 194. The sensing and deflection signal selection switch group 191 has the same circuit of the sensing and deflection signal selection switch group 191 in FIG. 8. FIG. 15 is the truth table of the sensing and deflection signal selection switch group 192 according to the present invention. A truth table in general form is shown in top of FIG. 15. The sensing and deflection signal selection switch group 192 in FIG. 12 is corresponding to k=2. The truth table for the sensing and deflection signal selection switch group 192 is derived with k=2, j=1 substituted into the top truth table.

FIG. 16 is the truth table of the sensing and deflection signal selection switch group 193 according to the present invention. A truth table in general form is shown in top of FIG. 16. The sensing and deflection signal selection switch group 193 in FIG. 16 is corresponding to k=2. The truth table for the sensing and deflection signal selection switch group 193 is derived with k=2, j=1 substituted into the top truth table.

FIG. 17 is the truth table of the sensing and deflection signal selection switch group 194 according to the present invention. A truth table in general form is shown in top of FIG. 17. The sensing and deflection signal selection switch group 194 in FIG. 17 is corresponding to k=1. The truth table for the sensing and deflection signal selection switch group 194 is derived with k=1, l=2 substituted into the top truth table.

Figure 18A:
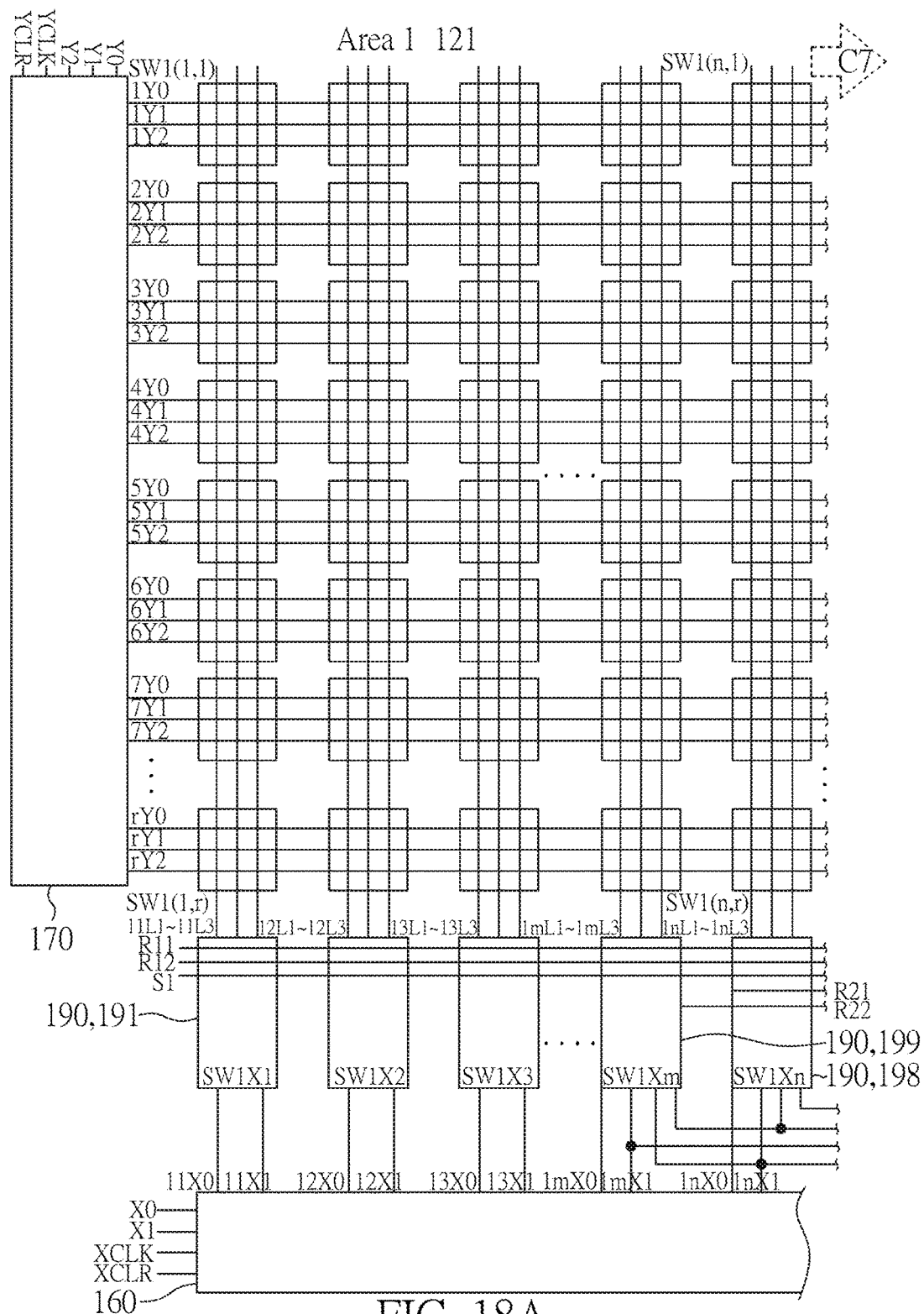
Figure 18B:
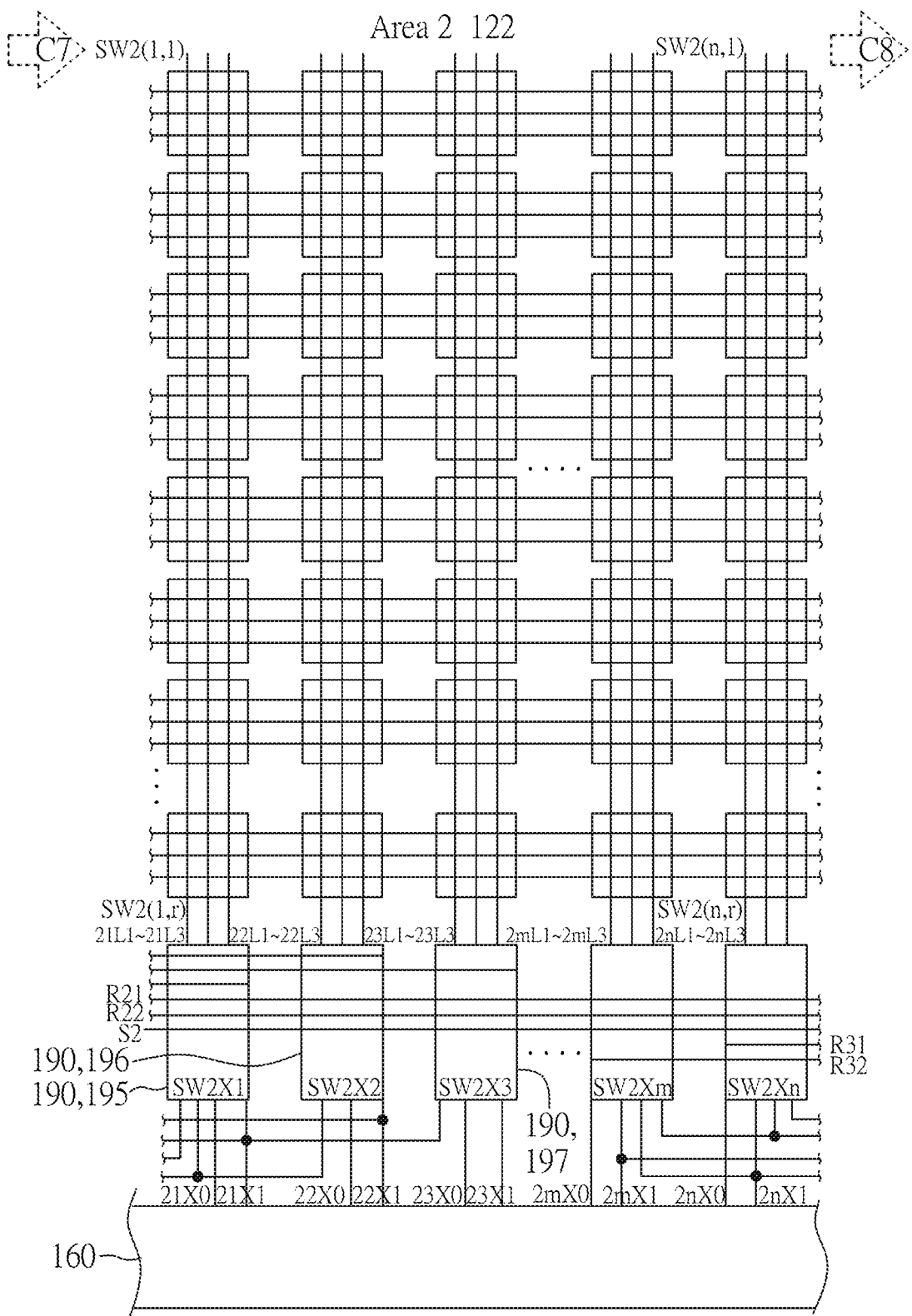
Figure 18C:
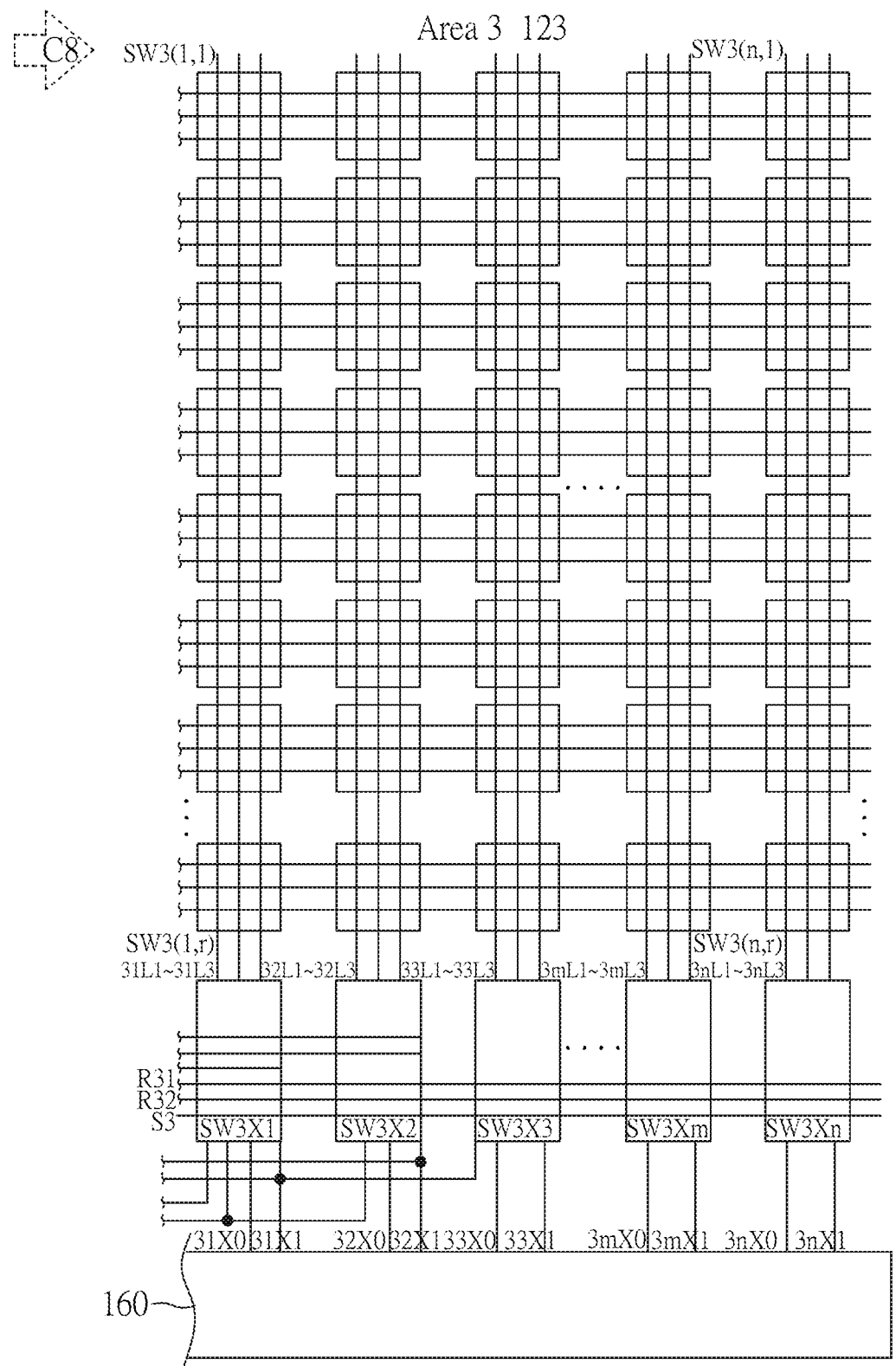

FIGS. 18A to 18C, FIGS. 19A to 19F and FIGS. 20A to 20F illustrate still further another operation and yet further another operation of the fingerprint identification device according to the present invention. In FIGS. 18A to 18C, the electrodes 125 on the substrate 110 are divided into a plurality of electrode areas 121, 122, 123, . . . . FIGS. 18A to 18C are similar to FIGS. 12A to 12C except that: the sensing stimulating signal line S1, the deflection focusing signal line R11 and the convergence stabilizing signal line R12 in the electrode area 121 extend to the electrode area 122, the deflection focusing signal line R21 and the convergence stabilizing signal line R22 in the electrode area 122 extend to the electrode area 121, and so on.

Figures 19A, 19B:
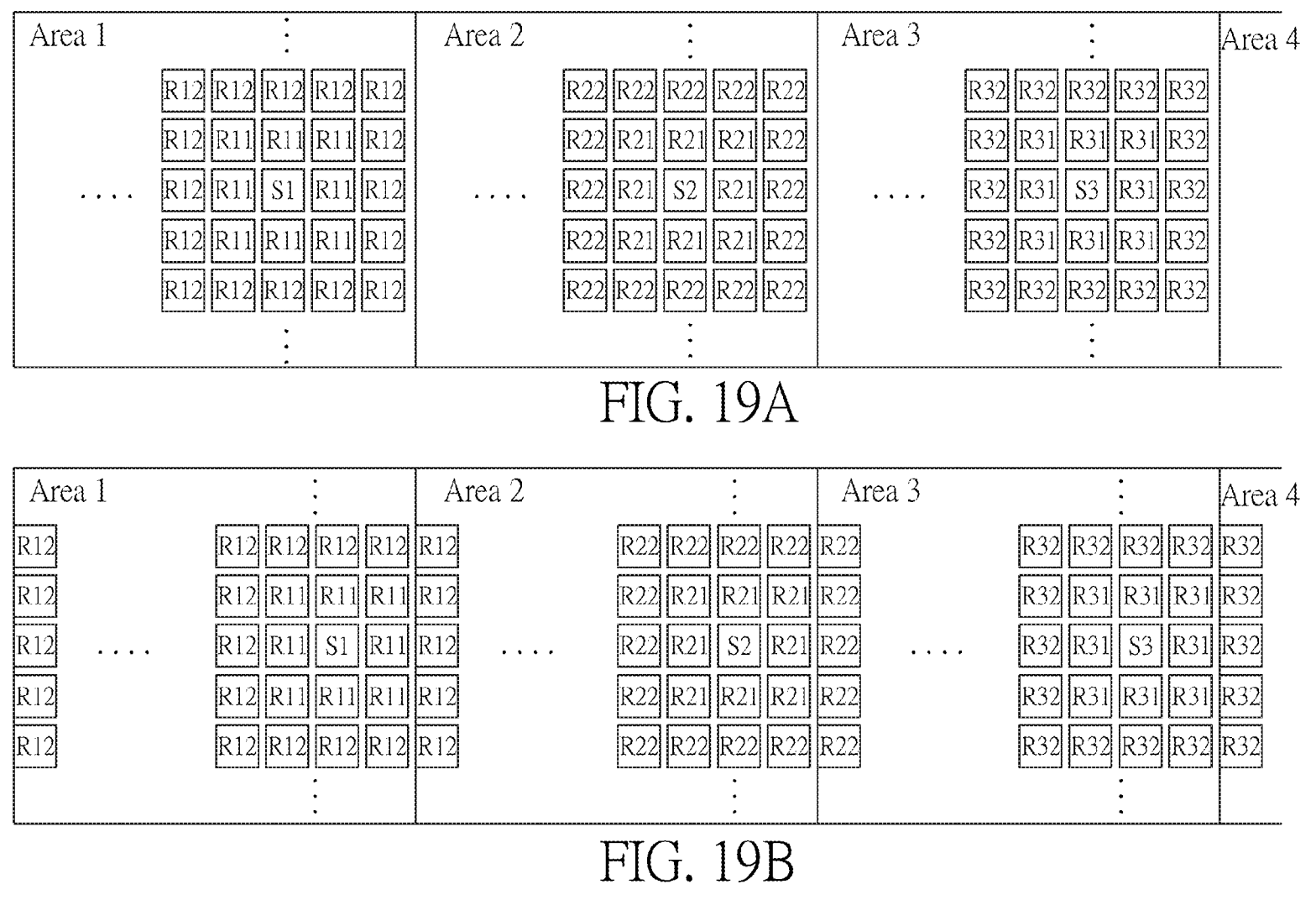
Figures 19C, 19D:
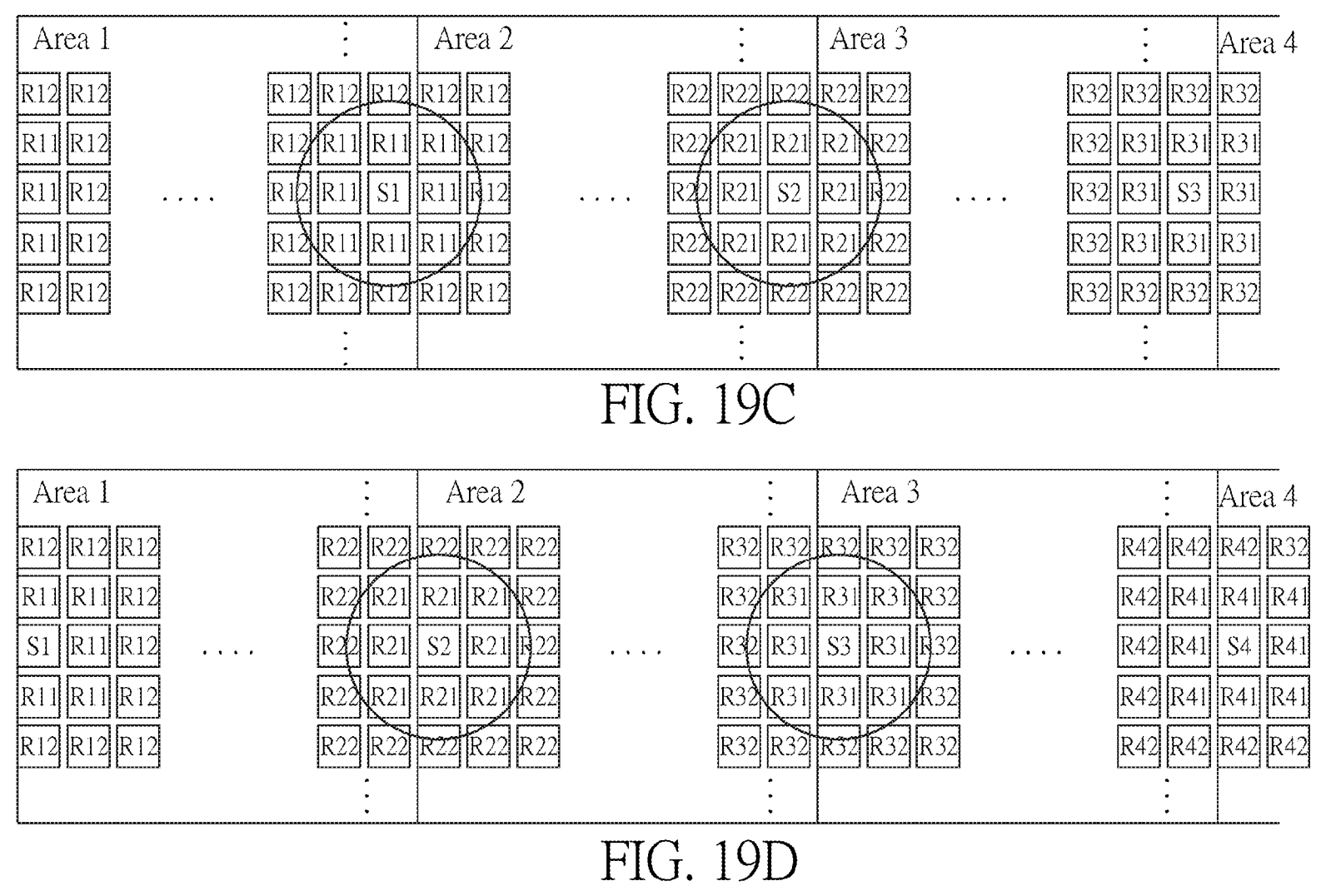
Figures 19E, 19F:
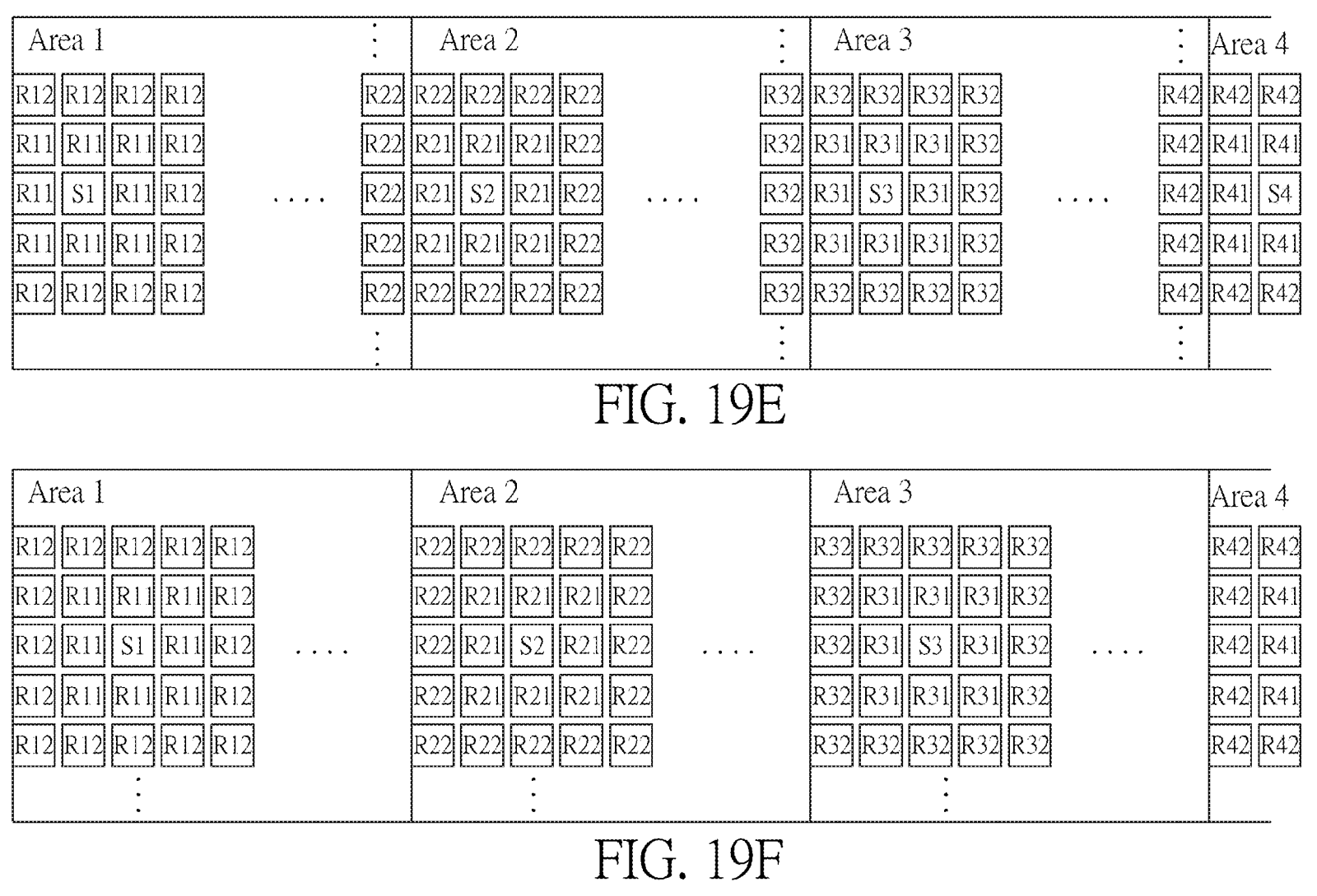

As shown in FIG. 19A, the electrode area group composed of the sensing area, the deflection focusing area and the convergence stabilizing area is located in the border between the electrode area 1 and the electrode area 2. As shown in FIG. 19B, the position of the electrode area group shifts across the border between the electrode area 1 and the electrode area 2 for over an electrode size. As shown in FIG. 19C, it shifts across for over two electrode sizes, and so on. It is noted that, as shown in FIG. 19C, the electrodes in the deflection focusing area originally in the electrode area 1 are still applied with the deflection focusing signal R11 for electrode area 1 after shifting across the electrode area 2, and all of the electrodes in the convergence stabilizing area are still applied with the convergence stabilizing signal for the electrode area 1. in FIG. 19D, after the electrodes in the sensing area shifts across the electrode area 2, not only the electrodes in the sensing area are applied with the sensing stimulating signal S2 instead, but also all of the electrodes in the deflection focusing area are applied with the deflection focusing signal R21 for the electrode area 2 instead, although the electrodes in the electrode area 1 in the deflection focusing area are still applied with the deflection focusing signal R21 for electrode area 2. And all of the electrodes in the convergence stabilizing area, wherever in the electrode area 1 or the electrode area 2, are applied with the convergence stabilizing signal R22 for electrode area 2. The electrodes in the electrode area group located in the border between the electrode area 2 and the electrode area 3 shift in a similar way.

Figures 20A, 20B:
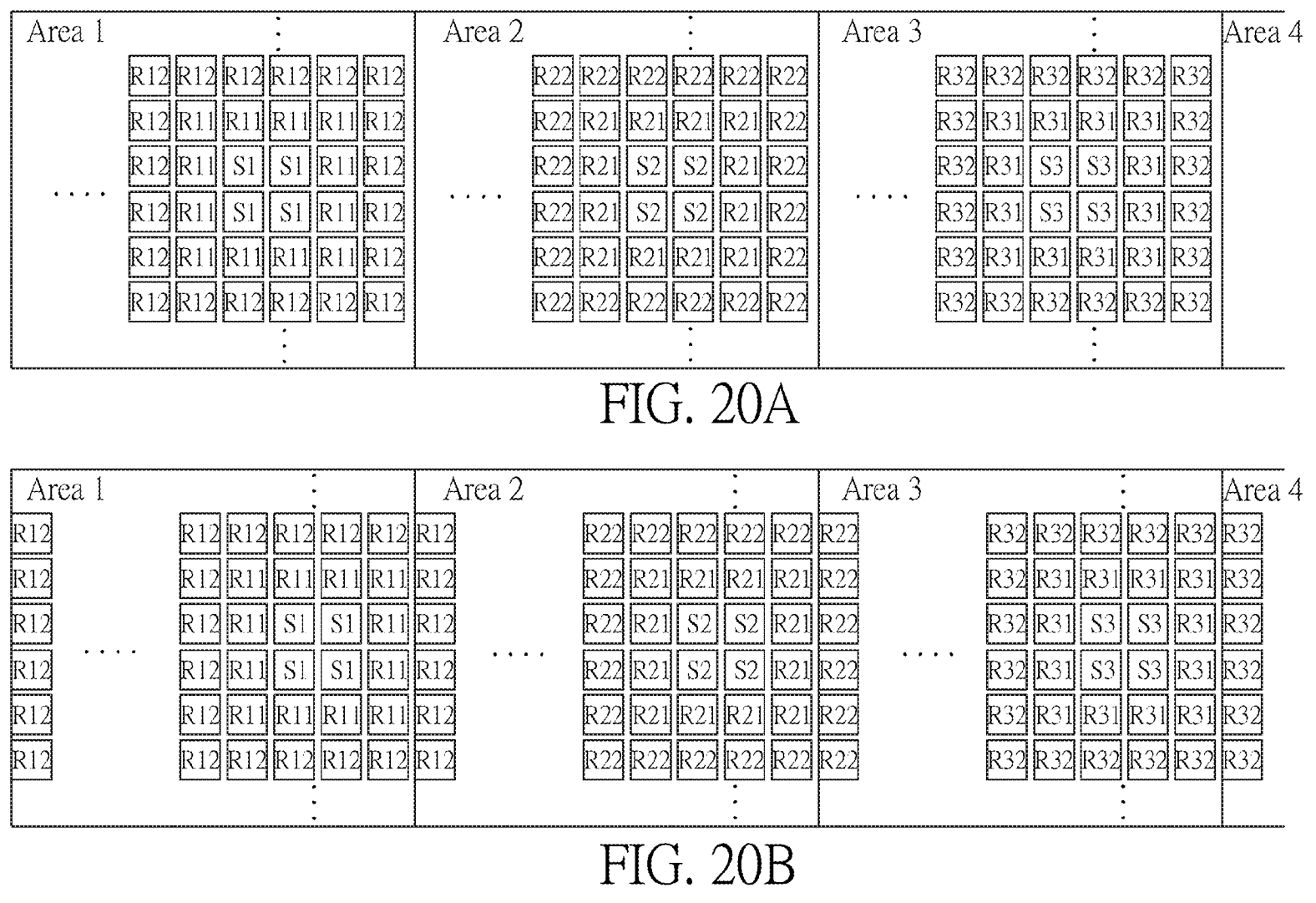
Figures 20C, 20D:
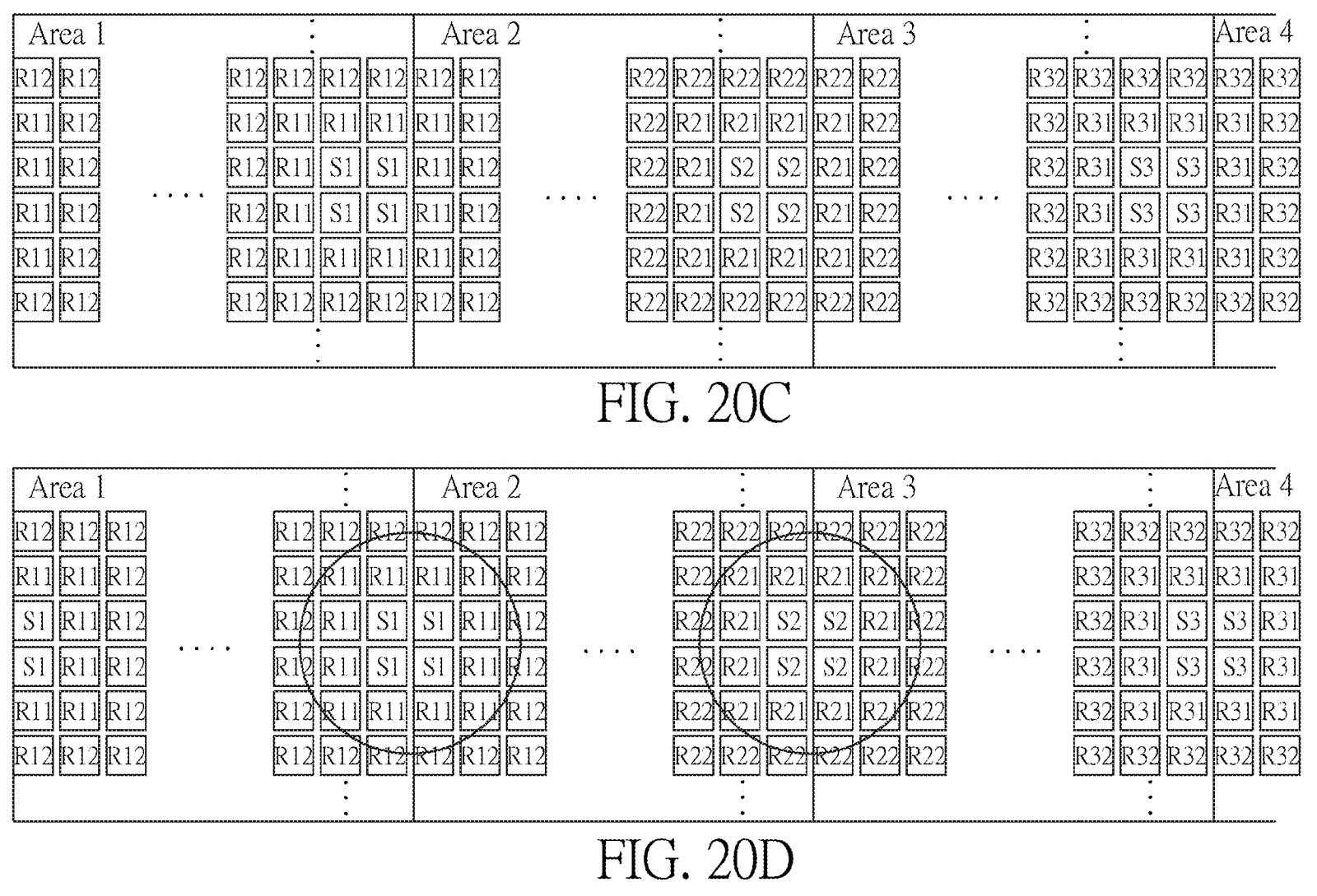
Figures 20E, 20F:
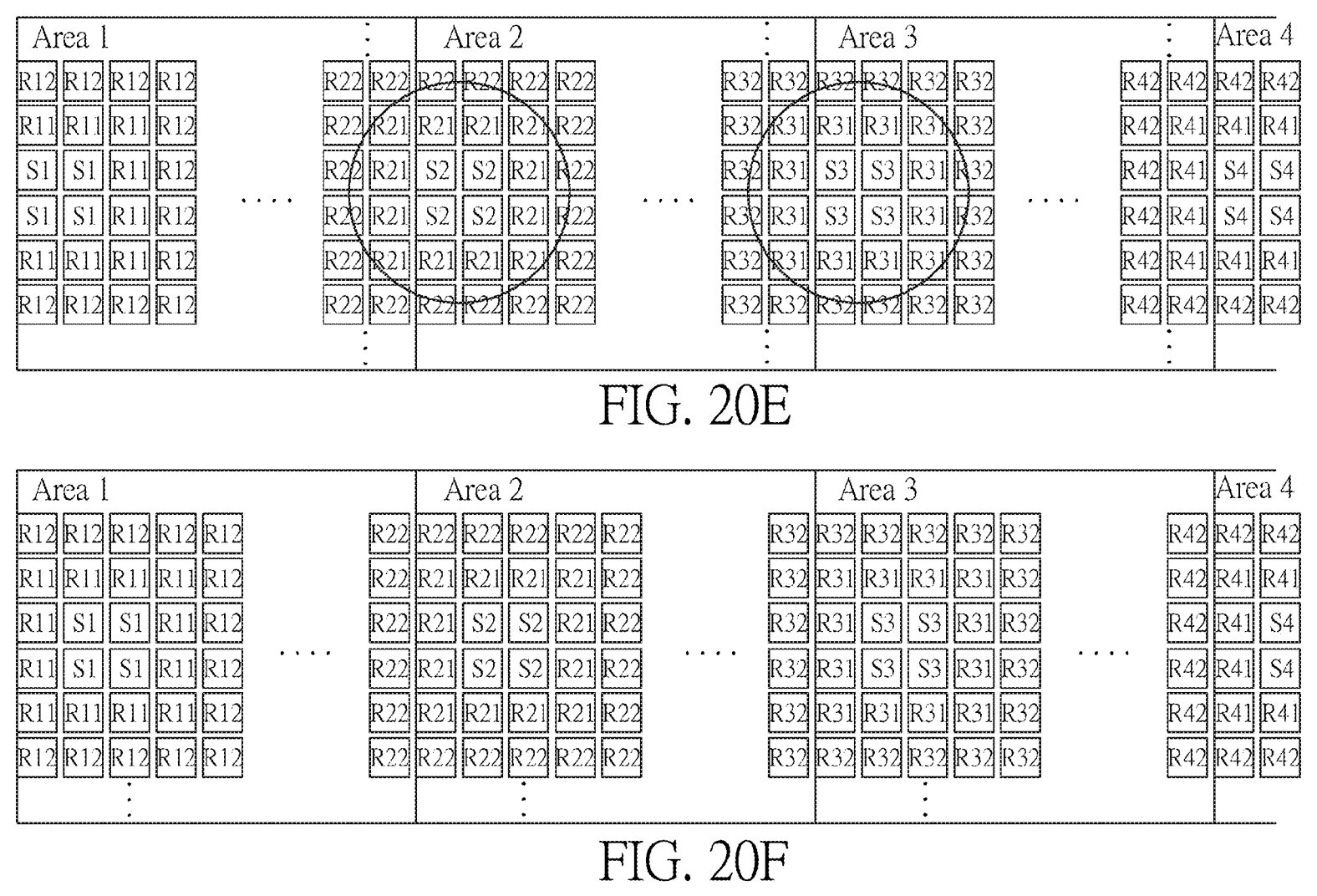

As shown in FIG. 20A, the electrode area group composed of the sensing area, the deflection focusing area and the convergence stabilizing area is located in the border between the electrode area I and the electrode area 2. As shown in FIG. 20B, the position of the electrode area group shifts across the border between the electrode area 1 and the electrode area 2 for over an electrode size. As shown in FIG. 20C, it shifts across for over two electrode sizes, and so on. It is noted that, as shown in FIG. 20D, when half of the electrodes in the sensing area in the electrode area group shift across into the electrode area 2, the electrodes in the deflection focusing area that has shifted across into the electrode area 2 are still applied with the deflection focusing signal R11 for electrode area 1, and all of the electrodes in the convergence stabilizing area are still applied with the convergence stabilizing signal R12 for electrode area 1. In FIG. 20E, when all of the electrodes in the sensing area in the electrode area group shift across into the electrode area 2, all of the electrode in the sensing area are applied with the sensing stimulating signal S2 for electrode area 2 instead, and all of the electrodes in the deflection focusing area are applied with the deflection focusing signal R21 for electrode area 2 instead, although the electrodes in the electrode area 1 in the deflection focusing area are still applied with the deflection focusing signal R21 for the electrode area 2. And all of the electrodes in the convergence stabilizing area are also applied with the convergence stabilizing signal R22 for the electrode area 2 instead. The electrodes in the electrode area group located in the border between the electrode area 2 and electrode area 3 shift in a similar way.

In the embodiment in FIGS. 20A to 20F, whether to apply the sensing stimulating signal, the deflection focusing signal and the convergence stabilizing signal depends on whether all of the electrodes in the sensing area in the electrode area group has been shifted across into the border; in other embodiment, the signal can be changed depending on the border-crossing of the electrodes in a sensing stimulating area; or the signal can be changed depending on the border-crossing of half of the electrodes in the sensing stimulating area; or the signal can be changed depending on border-crossing of part of the electrodes in the deflection focusing area. In addition, in the embodiments shown above, the deflection focusing area and convergence stabilizing area are each illustrated with a width of an electrodes size for example. However, the example is for description convenience and is not to limit the present invention.

To achieve the function in FIGS. 19A to 19F and FIGS. 20A to 20F, the sensing and deflection signal selection switch group in FIGS. 18A to 18C includes six types: a sensing and deflection signal selection switch group 191, a sensing and deflection signal selection switch group 195, a sensing and deflection signal selection switch group 196, a sensing and deflection signal selection switch group 197, a sensing and deflection signal selection switch group 198 and sensing and deflection signal selection switch group 199. The sensing and deflection signal selection switch group 191 have the same circuit as the sensing and deflection signal selection switch group 191 in FIG. 8. FIG. 21 is the truth table of the sensing and deflection signal selection switch group 195 according to the present invention. The sensing and deflection signal selection switch group 195 in FIG. 18 is corresponding to k=2. The truth table for the sensing and deflection signal selection switch group 195 is derived with k=2, j=1 substituted into the top truth table. The symbol "*" in FIG. 21 represents "don't care" in digital circuit design.

FIG. 22 is the truth table of the sensing and deflection signal selection switch group 196 according to the present invention. The sensing and deflection signal selection switch group 196 in FIGS. 18A to 18C is corresponding to k=2. The truth table for sensing and deflection signal selection switch group 196 is derived with k=2, j=1 substituted into the top truth table.

FIG. 23 is the truth table for the sensing and deflection signal selection switch group 197 according to the present invention. The sensing and deflection signal selection switch group 197 in FIGS. 18A to 18C is corresponding to k=2. The truth table for the sensing and deflection signal selection switch group 197 is derived with k=2, j=1 substituted into the top truth table. The symbol "*" in FIG. 23 represents "don't care" in digital circuit design.

FIG. 24 is the truth table of the sensing and deflection signal selection switch group 198 according to the present invention. The sensing and deflection signal selection switch group 198 in FIGS. 18A to 18C is corresponding to k=1. The truth table for the sensing and deflection signal selection switch group 198 is derived with k=1, I=2 substituted into the top truth table. The symbol "*" in FIG. 24 represents "don't care" in digital circuit design.

FIG. 25 is the truth table of the sensing and deflection signal selection switch group 199 according to the present invention. The sensing and deflection signal selection switch group 199 in FIGS. 18A to 18C is corresponding to k=1. The truth table for the sensing and deflection signal selection switch group 199 is derived with k=1, j=2 substituted into the top truth table. The symbol "*" in FIG. 25 represents "don't care" in digital circuit design.

With the truth table disclosed in the present invention, the one skilled in the art can achieve a digital circuit by the Synplify Pro synthesizer provided by Synplicity or the DC compiler synthesizer provided by Synopsis.

Figure 26:
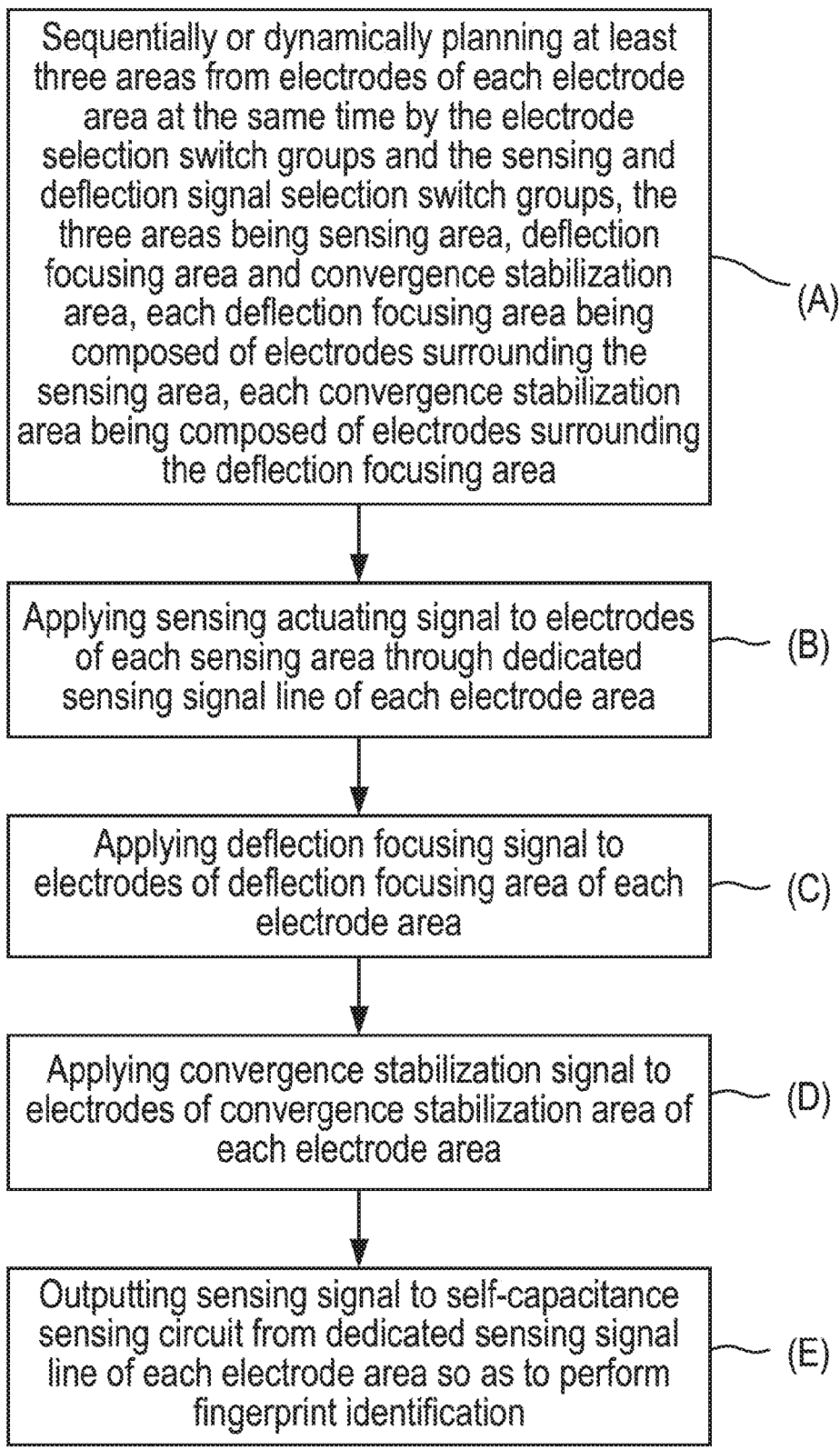
FIG. 26 is the flow chart of the fingerprint identification method according to the present invention.

FIG. 26 is the flow chart of fingerprint identification method according to the present invention. The fingerprint identification method is applied to the aforementioned fingerprint identification device 100. As shown in FIG. 1 or 2, the fingerprint identification device 100 includes a plurality of electrode areas 120. Each electrode area 120 includes at least one dedicated sensing signal line 150, a plurality of electrodes 125, a plurality of electrode selection switch groups 180 and a plurality of sensing and deflection signal selection switch groups 190. Each electrode selection switch group 180 is corresponding to an electrode 125. The electrodes 125 are disposed on a sensing surface in rows and column. Referring to FIG. 26, in step (A), the fingerprint identification method sequentially or dynamically configures the electrodes in the electrode area 120 into at least three areas through the electrode selection switch groups 180 and the sensing and deflection signal selection switch groups 190. The at least three areas are a sensing area, a deflection focusing area and a convergence stabilizing area, respectively, wherein each deflection focusing area is composed of the electrodes surrounding each sensing area, each convergence stabilizing area is composed of the electrodes surrounding each deflection focusing area.

In step (B), a sensing stimulating signal is applied to the electrodes in each sensing area through the at least one dedicated sensing signal line in each electrode area.

In step (C), a deflection focusing signal is applied to the electrodes in the deflection focusing area in each electrode area.

In step (D), a convergence stabilizing signal is applied to the electrodes in the convergence stabilizing area in each electrode area.

In step (E), a sensing signal is outputted from the at least one dedicated sensing signal line in each electrode area to a self-capacitance sensing circuit, for sensing a fingerprint.

In the present invention, the fingerprint identification device 100 is provided with at least two electrode areas 120. The electrode selection switch groups 180 sequentially or dynamically select at least one electrode from the electrodes 125 in the respective electrode areas 120 as a sensing electrode block (sensing area), and configure the electrodes surrounding the sensing electrode block (sensing area) as a plurality of corresponding deflection electrode blocks (deflection focusing area and convergence stabilizing area). Each sensing electrode block (sensing area) is corresponding to at least two deflection electrode blocks (deflection focusing area and convergence stabilizing area). Each deflection electrode block of the at least two deflection electrode blocks (deflection focusing area and convergence stabilizing area) includes a plurality of electrodes. The present invention can sequentially or dynamically select at least one electrode as a sensing electrode block (sensing area). When the sensing electrode block (sensing area) shifts across different electrode areas 120, it can select a deflection focusing signal in the original electrode area 120 to apply to the deflection focusing area, or select a deflection focusing signal in the new electrode area 120 to apply to the deflection focusing area, thereby gathering and pulling up the electric flux lines from the electrodes in the sensing area. Thus, it can enhance the sensing sensitivity, stability and accuracy, increase the sensing distance, improve the signal-noise ratio, and reduce the cost of fingerprint detection device.

Although the present invention has been explained in relation to its preferred embodiment, it is to be understood that many other possible modifications and variations can be made without departing from the spirit and scope of the invention as hereinafter claimed.

What is claimed is:

1. A fingerprint identification device, comprising:
   a substrate;
   at least two electrode areas, each electrode area includes a plurality of electrodes;
   at least one dedicated sensing signal line;
   at least one signal amplifier circuit with a gain not less than zero;
   a plurality of electrode selection switch groups; and
   a plurality of signal lines, divided into first directional signal lines and second directional signal lines, the first directional signal lines are perpendicular to the second directional signal lines,
   wherein the electrode selection switch groups sequentially or dynamically select at least one electrode from the electrodes in the respective electrode areas as sensing electrode block, and configure the electrodes surrounding the sensing electrode block as a plurality of corresponding deflection electrode blocks, each sensing electrode block being corresponding to at least two deflection electrode blocks, each deflection electrode block of the at least two deflection electrode blocks including a plurality of electrodes; and wherein the input end of the at least one signal amplifier circuit with a gain not less than zero is electrically connected to a sensing electrode block, and the output end thereof is electrically connected to at least one deflection electrode block of the at least two deflection electrode blocks.

2. The fingerprint identification device as claimed in claim 1, wherein the electrode selection switch groups are divided into a plurality of electrode area selection switch groups, each electrode selection switch group including at least one switch component and corresponding to at least one electrode.

3. The fingerprint identification device as claimed in claim 2, wherein each line of the plurality of signal lines is electrically connected to at least one electrode selection switch group of the plurality of electrode selection switch groups.

4. The fingerprint identification device as claimed in claim 1, wherein the electrode selection switch groups are field effect transistors or thin film transistors disposed on the substrate.

5. The fingerprint identification device as claimed in claim 1, wherein each sensing electrode block outputs at least one sensing signal.

6. The fingerprint identification device as claimed in claim 1, further comprising two shift registers arranged along a first direction and a second direction, respectively, and the two shift registers for shifting the position of the selected sensing electrode block and the deflection electrode blocks thereof along the first direction or the second direction, the first direction being perpendicular to the second direction.

7. A fingerprint identification method, which is applied in a fingerprint identification device, the fingerprint identification device including a plurality of electrode areas, each electrode area including at least one dedicated sensing signal line, a plurality of electrodes, a plurality of electrode selection switch groups and a plurality of sensing and deflection signal selection switch groups, each electrode selection switch group corresponding to an electrode, the electrodes are disposed on a sensing surface in rows and columns, the fingerprint identification method comprising:
   sequentially or dynamically configuring the electrodes in each electrode area into at least three areas through the electrode selection switch groups and the sensing and deflection signal selection switch groups, the at least three areas being a sensing area, a deflection focusing area and a convergence stabilizing area, respectively, wherein each deflection focusing area is composed of the electrodes surrounding each sensing area, and each convergence stabilizing area is composed of the electrodes surrounding the deflection focusing area;
   applying a sensing stimulating signal to the electrodes in each sensing area through the at least one dedicated sensing signal line in each electrode area;
   applying a deflection focusing signal to the electrodes in the deflection focusing area in each electrode area;
   applying a convergence stabilizing signal to the electrodes in the convergence stabilizing area in each electrode area; and
   outputting a sensing signal from the at least one dedicated sensing signal line in each electrode area to a self-capacitance sensing circuit, for sensing a fingerprint,
   wherein the convergence stabilizing signal applied to each electrode area is an inverted signal generated through a circuit from the sensing signal or the sensing stimulating signal in the corresponding sensing area.

8. The fingerprint identification method as claimed in claim 7, wherein the sensing stimulating signal is an AC signal.

9. The fingerprint identification method as claimed in claim 7, wherein the deflection focusing signal applied to each electrode area is an in-phase signal generated through a circuit from the sensing signal or the sensing stimulating signal in the corresponding sensing area.

10. The fingerprint identification method as claimed in claim 7, wherein the deflection focusing signal applied to each electrode area is the same in-phase signal generated through a circuit from the sensing signal or the sensing stimulating signal in a selected sensing area.

11. The fingerprint identification method as claimed in claim 7, wherein the convergence stabilizing signal applied on each electrode area is a DC reference voltage or a ground signal.

12. A fingerprint identification device, comprising:
   a substrate;
   at least two electrode areas, each electrode area includes a plurality of electrodes;

at least one dedicated sensing signal line;

at least one signal amplifier circuit with a gain not more than zero;

a plurality of electrode selection switch groups; and a plurality of signal lines, divided into first directional signal lines and second directional signal lines, the first directional signal lines are perpendicular to the second directional signal lines, wherein the electrode selection switch groups sequentially or dynamically select at least one electrode from the electrodes in the respective electrode areas as sensing electrode block, and configure the electrodes surrounding the sensing electrode block as a plurality of corresponding deflection electrode blocks, each sensing electrode block being corresponding to at least two deflection electrode blocks, each deflection electrode block of the at least two deflection electrode blocks including a plurality of electrodes; and wherein the input end the at least one signal amplifier circuit with a gain not more than zero is electrically connected to a sensing electrode block, and the output end thereof is electrically connected to at least one deflection electrode block of the at least two deflection electrode blocks.

13. A fingerprint identification method, which is applied in a fingerprint identification device, the fingerprint identification device including a plurality of electrode areas, each electrode area including at least one dedicated sensing signal line, a plurality of electrodes, a plurality of electrode selection switch groups and a plurality of sensing and deflection signal selection switch groups, each electrode selection switch group corresponding to an electrode, the electrodes are disposed on a sensing surface in rows and columns, the fingerprint identification method comprising:

sequentially or dynamically configuring the electrodes in each electrode area into at least three areas through the electrode selection switch groups and the sensing and deflection signal selection switch groups, the at least three areas being a sensing area, a deflection focusing area and a convergence stabilizing area, respectively, wherein each deflection focusing area is composed of the electrodes surrounding each sensing area, and each convergence stabilizing area is composed of the electrodes surrounding the deflection focusing area;

applying a sensing stimulating signal to the electrodes in each sensing area through the at least one dedicated sensing signal line in each electrode area;

applying a deflection focusing signal to the electrodes in the deflection focusing area in each electrode area;

applying a convergence stabilizing signal to the electrodes in the convergence stabilizing area in each electrode area; and outputting a sensing signal from the at least one dedicated sensing signal line in each electrode area to a self-capacitance sensing circuit, for sensing a fingerprint, wherein convergence stabilizing signal applied to each electrode area is the invert signal generated through a circuit from the sensing signal or the sensing stimulating signal in a selected sensing area.

* * * * *